(12) United States Patent
Heo et al.

(10) Patent No.: US 12,721,199 B2
(45) Date of Patent: Aug. 25, 2026

(54) SEMICONDUCTOR PACKAGE

(71) Applicant: SAMSUNG ELECTRONICS CO., LTD., Suwon-si (KR)

(72) Inventors: Giseung Heo, Suwon-si (KR); Seonkyu Kim, Suwon-si (KR); Joonseok Oh, Suwon-si (KR); Kyunghee Lee, Suwon-si (KR); Junghyun Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 708 days.

(21) Appl. No.: 18/113,164

(22) Filed: Feb. 23, 2023

(65) Prior Publication Data

US 2023/0307340 A1 Sep. 28, 2023

(30) Foreign Application Priority Data

Mar. 23, 2022 (KR) ........................ 10-2022-0036229

(51) Int. Cl.

*H10W 70/685* (2026.01)
*H10B 80/00* (2023.01)

(Continued)

(52) U.S. Cl.

CPC .......... *H10W 70/685* (2026.01); *H10B 80/00* (2023.02); *H10W 70/05* (2026.01);

(Continued)

(58) Field of Classification Search

CPC ............... H01L 23/14; H01L 23/49534; H01L 23/49544; H01L 23/49548;

(Continued)

(56) References Cited

U.S. PATENT DOCUMENTS

| | | | |
|---|---|---|---|
| 7,215,033 | B2 | 5/2007 | Lee et al. |
| 9,087,832 | B2 | 7/2015 | Huang et al. |
| 9,391,041 | B2 | 7/2016 | Lin |
| 10,510,690 | B2 | 12/2019 | Jeng et al. |

(Continued)

FOREIGN PATENT DOCUMENTS

| | | |
|---|---|---|
| KR | 10-0621992 | 9/2006 |
| KR | 10-2011-0024997 A | 3/2011 |

(Continued)

OTHER PUBLICATIONS

Office Action in Korean Appln. No. 10-2022-0036229, mailed on Oct. 21, 2025, 20 pages (with English translation).

*Primary Examiner* — Evan G Clinton
(74) *Attorney, Agent, or Firm* — Fish & Richardson P.C.

(57) ABSTRACT

A semiconductor package includes; a first redistribution structure, a chip disposed on the first redistribution structure, and a package body disposed on the first redistribution structure and covering opposing side surfaces of the chip. The first redistribution structure includes; a vertically stacked plurality of redistribution layers, a respectively intervening plurality of passivation layers insulating the plurality of redistribution layers, and a plurality of redistribution vias penetrating the plurality of passivation layers to electrically connect redistribution layers among the plurality of redistribution layers, wherein each passivation layer among the plurality of passivation layers includes a diffusion barrier layer formed on a corresponding redistribution layer among the plurality of redistribution layers, and a warpage control layer formed on the diffusion barrier layer.

18 Claims, 25 Drawing Sheets

(51) Int. Cl.

| | |
|---|---|
| ***H10W 70/05*** | (2026.01) |
| ***H10W 70/69*** | (2026.01) |
| *H10W 70/652* | (2026.01) |
| *H10W 74/10* | (2026.01) |
| *H10W 90/00* | (2026.01) |

(52) U.S. Cl.

CPC ........ *H10W 70/69* (2026.01); *H10W 70/6528* (2026.01); *H10W 74/117* (2026.01); *H10W 90/724* (2026.01); *H10W 90/794* (2026.01)

(58) Field of Classification Search

CPC ....... H01L 23/49579–49586; H01L 23/49822; H01L 23/49838–49844; H01L 23/49894; H01L 23/49866; H01L 23/5383; H01L 23/5386; H01L 23/5389; H10W 70/06; H10W 70/685; H10W 70/05; H10W 70/69; H10W 74/117; H10W 70/60; H10W 76/15385; H10W 76/153

See application file for complete search history.

(56) References Cited

U.S. PATENT DOCUMENTS

| | | | | |
|---|---|---|---|---|
| 10,541,198 | B2 | 1/2020 | Chang Chien et al. | |
| 10,541,217 | B2 | 1/2020 | Wu | |
| 10,541,228 | B2 | 1/2020 | Chen et al. | |
| 10,707,150 | B2 | 7/2020 | Shim et al. | |
| 10,943,858 | B2 | 3/2021 | Kelly et al. | |
| 2010/0052164 | A1 | 3/2010 | Lee et al. | |
| 2016/0358847 | A1* | 12/2016 | Shih | H01L 23/5383 |
| 2019/0355680 | A1* | 11/2019 | Chuang | H01L 23/5385 |
| 2022/0037306 | A1* | 2/2022 | You | H01L 24/24 |
| 2022/0068779 | A1* | 3/2022 | Kweon | H01L 23/49838 |

FOREIGN PATENT DOCUMENTS

| | | |
|---|---|---|
| KR | 10-1214746 | 12/2012 |
| KR | 10-1536045 | 7/2015 |
| KR | 10-2017-0022761 A | 3/2017 |
| KR | 10-2022-0000273 A | 1/2022 |
| KR | 10-2022-0016689 A | 2/2022 |

* cited by examiner

FIG. 4
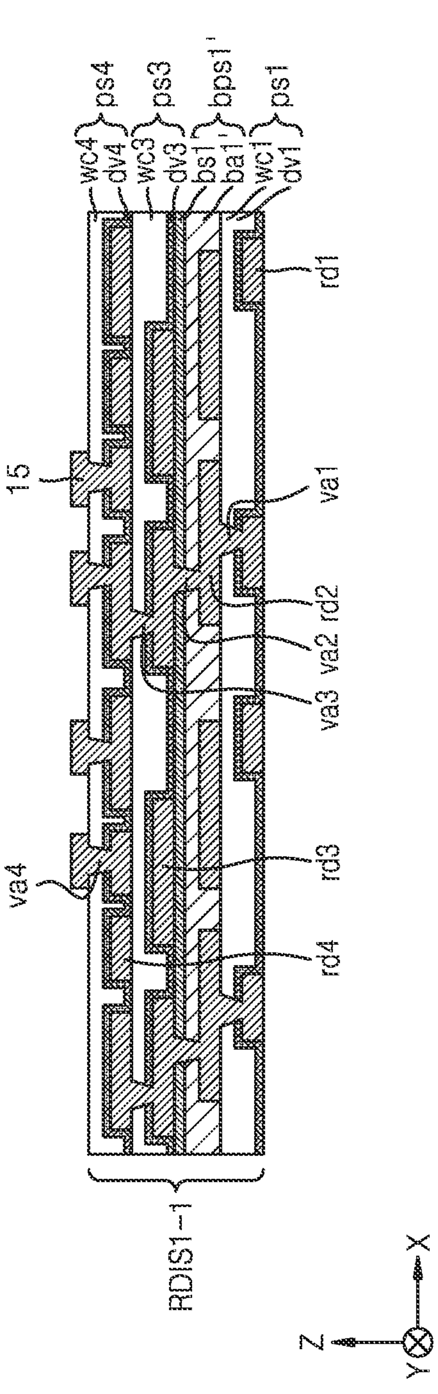

EX6
31
29
wc7
dv7
ps7
wc6
dv6
ps6
wc5
dv5
ps5
27
23(PB1)
19
21
15
wc4
dv4
ps4
wc3
dv3
ps3
wc2
dv2
ps2
wc1
dv1
ps1
11
13
rd1
rd5
rd6
rd7
va5
va6
va1
rd2
va2
va3
rd3
rd4
FO
FI
FO
va7
RDIS2
FICS1
25
17
va4
15'
va4'
RDIS1
Z
X
Y

FIG. 15

SEMICONDUCTOR PACKAGE

CROSS-REFERENCE TO RELATED APPLICATION

This application claims priority under 35 U.S.C. § 119 to Korean Patent Application No. 10-2022-0036229 filed on Mar. 23, 2022 in the Korean Intellectual Property Office, the subject matter of which is hereby incorporated by reference in its entirety.

BACKGROUND

The inventive concept relates generally to semiconductor packages, and more particularly, to semiconductor packages including a redistribution structure.

As the integration density of semiconductor chips increases, sizes and spacing characteristics for constituent components of the semiconductor chips have been reduced. Semiconductor packages may include a redistribution structure that provides more convenient access to certain elements (e.g., chip pads). Accordingly, the reliability and pattern precision of redistribution structures has become an important design consideration.

SUMMARY

Embodiments of the inventive concept provide semiconductor packages including a redistribution structure exhibiting improved reliability and pattern precision.

According to an aspect of the inventive concept, there is provided a semiconductor package including; a first redistribution structure, a chip disposed on the first redistribution structure, and a package body disposed on the first redistribution structure and covering opposing side surfaces of the chip, wherein the first redistribution structure includes; a vertically stacked plurality of redistribution layers, a respectively intervening plurality of passivation layers insulating the plurality of redistribution layers, and a plurality of redistribution vias penetrating the plurality of passivation layers to electrically connect redistribution layers among the plurality of redistribution layers, wherein each passivation layer among the plurality of passivation layers includes a diffusion barrier layer formed on a corresponding redistribution layer among the plurality of redistribution layers, and a warpage control layer formed on the diffusion barrier layer.

According to an aspect of the inventive concept, there is provided a semiconductor package including; a package body including a fan-in area and a fan-out area surrounding the fan-in area, wherein the fan-out area includes a body wiring structure, a fan-in chip structure disposed in the fan-in area, wherein the fan-in chip structure includes a chip, and a first redistribution structure disposed under the fan-in area and the fan-out area and electrically connected to the body wiring structure, wherein the first redistribution structure includes; a vertically stacked plurality of redistribution layers, a respectively intervening plurality of passivation layers insulating the plurality of redistribution layers, and a plurality of redistribution vias penetrating the plurality of passivation layers to electrically connect redistribution layers among the plurality of redistribution layers, wherein each passivation layer among the plurality of passivation layers includes a diffusion barrier layer formed on a corresponding redistribution layer among the plurality of redistribution layers, and a warpage control layer formed on the diffusion barrier layer.

According to an aspect of the inventive concept, there is provided a semiconductor package including; a first redistribution structure, a chip disposed on the first redistribution structure, wherein the chip includes a backend level wiring layer and a chip pad electrically connected to the back end level wiring layer, and a package body disposed on the first redistribution structure and covering opposing side surfaces of the chip, wherein the first redistribution structure includes; a vertically stacked plurality of redistribution layers, wherein the chip pad is electrically connected to an uppermost redistribution layer among the plurality of redistribution layers, a respectively intervening plurality of passivation layers insulating the plurality of redistribution layers, and a plurality of redistribution vias penetrating the plurality of passivation layers to electrically connect redistribution layers among the plurality of redistribution layers, wherein each passivation layer among the plurality of passivation layers includes a diffusion barrier layer formed on a corresponding redistribution layer among the plurality of redistribution layers, and a warpage control layer formed on the diffusion barrier layer.

BRIEF DESCRIPTION OF THE DRAWINGS

Advantages, benefits and features, as well as the making an use of the inventive concept may be more clearly understood upon consideration of the following detailed description together with the accompanying drawings, in which:

FIGS. 4, 5, 6, 7, 8, 9, 10, 11, 12, 13, 14 and 15 are respective cross-sectional views illustrating various semiconductor packages including more or more redistribution structures according to embodiments of the inventive concept;

DETAILED DESCRIPTION

Hereinafter, certain embodiments of the inventive concept will be described in some additional detail with reference to the accompanying drawings.

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
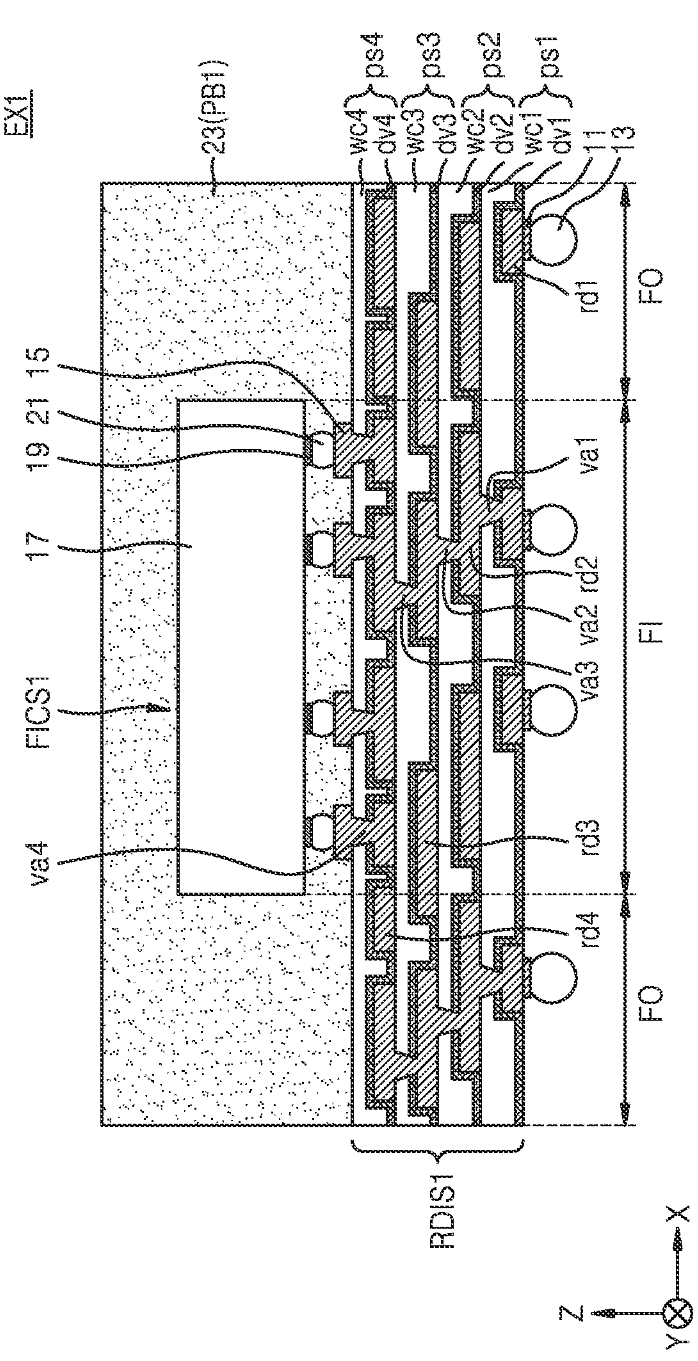
FIG. 1 is a cross-sectional view illustrating a semiconductor package according to embodiments of the inventive concept.
Figure 2:
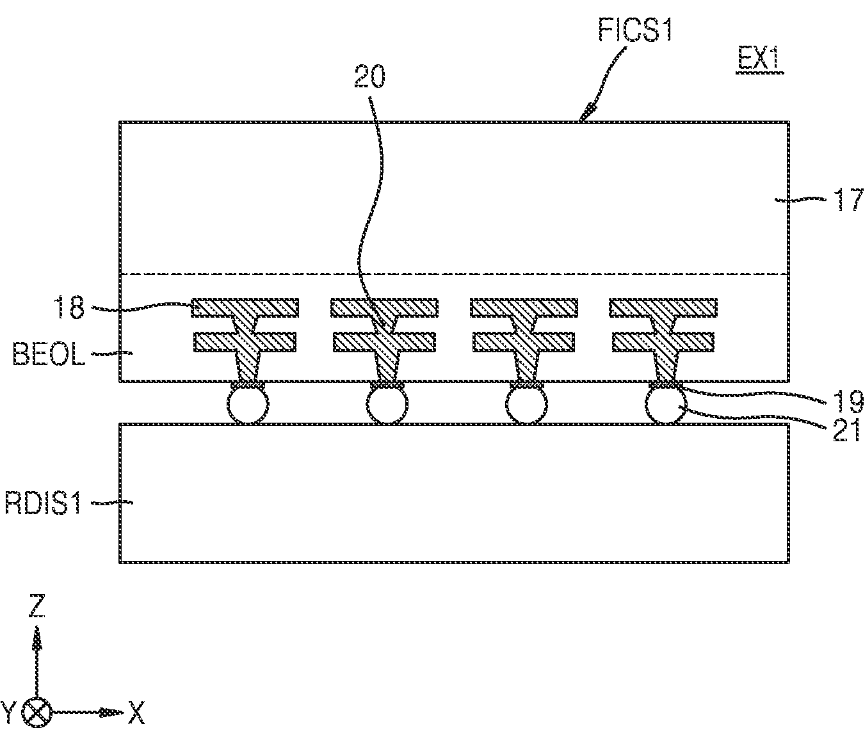
FIGS. 2 and 3 are respective, enlarged views further illustrating a connection between a chip and a first redistribution structure in the semiconductor package of FIG. 1.
Figure 3:
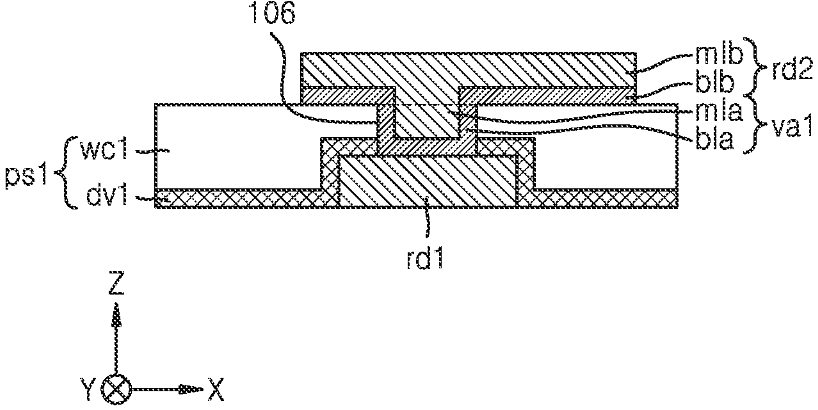

FIG. 1 is a cross-sectional view illustrating of a semiconductor package EX1 according to embodiments of the inventive concept, FIG. 2 is an enlarged view further illustrating a connection relationship between a chip and the first redistribution structure of FIG. 1, and FIG. 3 is an enlarged view illustrating a portion of the first redistribution structure of FIG. 1.

Referring to FIGS. 1, 2 and 3, the semiconductor package EX1 may include a first redistribution structure RDIS1, a chip 17, and an encapsulation layer 23. In some embodiments, the semiconductor package EX1 may be a fan-out semiconductor package. The chip 17 may be disposed on the first redistribution structure RDIS1, and the encapsulation layer 23 may be formed on the first redistribution structure RDIS1 to cover opposing side surfaces of the chip 17. The encapsulation layer 23 may include a molding layer, such as an epoxy molding compound (EMC).

Thus, the semiconductor package EX1 and surrounding encapsulation layer 23 may be understood as forming a first package body PB1 including a fan-in area FI including the chip 17, and at least opposing fan-out areas FO respectively disposed on both sides of the fan-in area FI. However, in some embodiments, fan-out areas FO may substantially surround the fan-in area FI.

In the semiconductor package EX1, a fan-in chip structure FICS1 including the chip 17 may be disposed in the fan-in area FI. In some embodiments, the first redistribution structure RDIS1 corresponding to the fan-in chip structure FICS1 may correspond to the fan-in area FI. The portion of the first package body PB1 other than the fan-in chip structure FICS1 and the portion of the first redistribution structure RDIS1 corresponding to the fan-in chip structure FICS1 may correspond to the fan-out areas FO. Thus, the semiconductor package EX1 may be a fan out wafer level package (FOWLP).

In some embodiments and referring to FIG. 2, the chip 17 may include a backend level wiring layer BEOL. The backend level wiring layer BEOL may include a backend wiring layer 18 and a backend via layer 20. The backend level wiring layer BEOL may be electrically connected to a chip pad 19. The chip pad 19 may be electrically connected to the first redistribution structure RDIS1 through an internal connection terminal 21. In some embodiments, the internal connection terminal 21 may be a solder ball or a solder bump.

The chip 17 may be a logic chip, a power management integrated circuit (PMIC) chip, a memory chip, etc. In some embodiments, the logic chip may be a memory controller chip, a central processing unit (CPU) chip, a graphics processing unit (GPU) chip, an application processor (AP) chip, etc.

In some embodiments, the memory chip may be a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, a resistive random access memory (RRAM) chip, etc. In the illustrated example of FIGS. 1 and 2, the chip 17 is assumed to be a single chip 17, however in other embodiments, the chip 17 may be a laminated chip including a number of vertically stacked chips (e.g., in a vertical direction substantially perpendicular to a horizontal plane defined in relation to a principal surface of the first redistribution structure RDIS1).

The first redistribution structure RDIS1 may include a vertically stacked plurality of redistribution layers rd1, rd2, rd3, and rd4, a respectively intervening plurality of passivation layers ps1, ps2, ps3, and ps4 insulating each of the plurality of redistribution layers rd1, rd2, rd3, and rd4, and a plurality of redistribution vias va1, va2, va3, and va4 variously configured to electrically connect the plurality of redistribution layers rd1, rd2, rd3, and rd4 through the plurality of passivation layers ps1, ps2, ps3, and ps4. In this regard in some embodiments of the inventive concept, the plurality of passivation layers ps1, ps2, ps3, and ps4 may be referred to as a plurality of intervening passivation layers ps1, ps2, ps3, and ps4 in relation to the plurality of vertically stacked redistribution layers rd1, rd2, rd3, and rd4.

The semiconductor package EX1 illustrated in FIG. 1 assumes that the plurality of redistribution layers includes four (4) redistribution layers rd1, rd2, rd3, and rd4, the plurality of passivation layer layers includes four (4) passivation layers ps1, ps2, ps3, and ps4, and the plurality of redistribution vias includes four (4) redistribution vias va1, va2, va3, and va4—but these are merely selected examples and embodiments of the inventive concept may include any reasonable number of variously arranged redistribution layers, passivation layer layers, and/or redistribution vias.

Each of the redistribution layers rd1, rd2, rd3, and rd4 may include a metal layer (e.g., a copper layer), extend in a horizontal direction (e.g., a direction substantially parallel to the principal surface of the first redistribution structure RDIS1, such as the X direction), and be vertically separated (or spaced apart) from at least one other redistribution layer among the plurality of redistribution layers in the vertical direction.

Each of the passivation layers ps1, ps2, ps3, and ps4 may include a diffusion barrier layer dv1, dv2, dv3, and dv4 respectively formed on a corresponding redistribution layer rd1, rd2, rd3, and rd4, as well as a warpage control layer wc1, wc2, wc3, and wc4 respectively formed on a corresponding one of the diffusion barrier layers dv1, dv2, dv3, and dv4. Thus, for example, a first passivation layer ps1 may include a first diffusion barrier layer dv1 formed on a first redistribution layer rd1, and a first warpage control layer wc1 formed on the first diffusion barrier layer dv1. Other passivation layers (e.g., ps2, ps3 and ps4) may be similarly formed, disposed and indicated.

In some embodiments, each of the diffusion barrier layers dv1, dv2, dv3, and dv4 may include a silicon nitride layer that is inorganic (e.g., a SiN layer and/or a $Si_3N_4$ layer). With this configuration, the respective diffusion barrier layers dv1, dv2, dv3, and dv4 may inhibit the migration or diffusion of metal (e.g., copper) from the redistribution layers rd1, rd2, rd3, and rd4.

In some embodiments, the silicon nitride layer constituting each of the diffusion barrier layers dv1, dv2, dv3, and dv4 may be "formed on" a corresponding redistribution layer using chemical vapor deposition at a low temperature (e.g., a process temperature of about 200° C. or less—or more particularly in some embodiments, a process temperature ranging from about 150° C. to about 200° C.). And because the diffusion barrier layers dv1, dv2, dv3, and dv4 are formed using a relatively low temperature process, warpage of the semiconductor package EX1 may be reduced.

The warpage control layers wc1, wc2, wc3, and wc4 may be respectively disposed between upper portions of the diffusion barrier layers dv1, dv2, dv3, and dv4 and the redistribution patterns rd1, rd2, rd3, and rd4. In some embodiment, the warpage control layers wc1, wc2, wc3, and wc4 may be relatively thicker than the diffusion barrier layers dv1, dv2, dv3, and dv4.

In some embodiment, the warpage control layers wc1, wc2, wc3, and wc4 may be formed from an inorganic silicon oxide layer (i.e., a $SiO_2$ layer).

In some embodiments, the inorganic silicon oxide layers constituting the warpage control layers wc1, wc2, wc3, and wc4 may be formed using chemical vapor deposition at a low temperature (e.g., a process temperature of about 200° C. or less, or more particularly in some embodiments, a process temperature ranging from about 150° C. to about 200° C.).

The warpage control layers wc1, wc2, wc3, and wc4 serve to control warpage of the semiconductor package EX1.

Each of the redistribution vias va1, va2, va3, and va4 may include metal (e.g., copper). As illustrated in FIG. 1, the redistribution vias may penetrate a passivation layer to variously interconnect redistribution layers.

A first redistribution pad 11 may be connected to the first redistribution layer rd1, and a first external connection terminal 13 may be connected to the first redistribution pad 11.

With reference to FIG. 1, the first, second and third redistribution vias va1, va2, and va3 may variously and electrically connect the first and second redistribution layers rd1 and rd2, the second and third redistribution layers rd2 and rd3, and the third and fourth redistribution layers rd3 and rd4, respectively.

In some embodiments, the fourth redistribution via va4 may serve as a chip connection through a second redistribution pad 15 disposed on the fourth redistribution via va4, and the internal connection terminal 21 connected to the second redistribution pad 15.

Referring to FIG. 3, each of the first redistribution layer rd1 and the second redistribution layer rd2 may include a plurality of redistribution patterns. The first passivation layer ps1 may be formed between the first redistribution layer rd1 and the second redistribution layer rd2 in the vertical direction. The first passivation layer ps1 may include the first diffusion barrier layer dv1 and the first warpage control layer wc1. The first diffusion barrier layer dv1 may surround the first redistribution layer rd1. The first warpage control layer wc1 may be formed on the first diffusion barrier layer dv1.

The first redistribution via va1 may be formed in a via hole 106 extending through the first passivation layer ps1. The first redistribution via va1 and the second redistribution layer rd2 may be formed on the first passivation layer ps1 and the first redistribution layer rd1 to be. The first redistribution via va1 may fill the via hole 106.

The first redistribution via va1 may include a first barrier metal layer b1*a* and a first redistribution via metal layer m1*a*. The second redistribution layer rd2 may include a second barrier metal layer b1*b* and a second redistribution metal layer m1*b*.

However, in some embodiment, the first barrier metal layer b1*a* and the second barrier metal layer b1*b* may be omitted. The first barrier metal layer b1*a* and the second barrier metal layer b1*b* may be formed using the same process and may form a single body. For example, the first barrier metal layer b1*a* and the second barrier metal layer b1*b* may be formed of Ti, Ta, etc.

The first redistribution via metal layer m1*a* and the second redistribution metal layer m1*b* may be formed using the same process and may form a single body. The first redistribution via metal layer m1*a* and the second redistribution metal layer m1*b* may include copper layers.

Thus, the illustrated example of FIG. 1 includes the first redistribution structure RDIS1 including passivation layers ps1, ps2, ps3, and ps4, wherein the passivation layers ps1, ps2, ps3, and ps4 respectively include diffusion barrier layers dv1, dv2, dv3, and dv4 and warpage control layers wc1, wc2, wc3, and wc4, respectively. Here, the diffusion barrier layers dv1, dv2, dv3, and dv4 and the warpage control layers wc1, wc2, wc3, and wc4 may include silicon nitride and/or silicon oxide formed using a low-temperature process. Accordingly, the semiconductor package EX1 of FIG. 1 may effectively compensate for warpage, albeit with reduced package thickness and improved package reliability. Additionally, the semiconductor package EX1 of FIG. 1 improves pattern precision of the redistribution pattern through a fine patterning process of the diffusion barrier layers dv1, dv2, dv3, dv4 and the warpage control layers wc1, wc2, wc3, and wc4, thereby providing a finely formed redistribution pattern.

FIG. 4 is a cross-sectional view illustrating a first redistribution structure RDIS1-1 of a semiconductor package according to embodiments of the inventive concept.

The first redistribution structure RDIS1-1 of FIG. 4 is substantially similar to that of the first redistribution structure RDIS1 of FIG. 1, except for the inclusion of a base passivation layer bps1' as a replacement for one of the plurality passivation layers (e.g., the second passivation layer ps2). Thus, in the illustrated example of FIG. 4, the base passivation layer bps1' is disposed on the second redistribution layer rd2 and between the first and third passivation layers ps1 and ps3, however the base passivation layer bps1' may be otherwise disposed. And in some embodiments, the plurality passivation layers may include more than one base passivation layers.

The first redistribution structure RDIS1-1 may include a plurality of rewiring vias va1, va2, va3, and va4 that variously and electrically connect the redistribution layers rd1, rd2, rd3, and rd4 through the passivation layers ps1, ps3, and pa4, as well as the base passivation layer bps1'.

With reference to FIG. 3, the base passivation layer bps1' may include a base layer ba1' and a base support layer bs1' disposed on the base layer ba1'. The base layer ba1' may include a photo imageable dielectric (PID) layer. The base support layer bs1' may include a metal layer, for example, a titanium layer.

Similar to the first redistribution structure RDISI1 of FIG. 1, the first redistribution structure RDIS1-1 of FIG. 4 may be used to control warpage with reduced package thickness and improved package reliability by the inclusion of a plurality of passivation layers including one or more base passivation layer(s).

Figure 5:
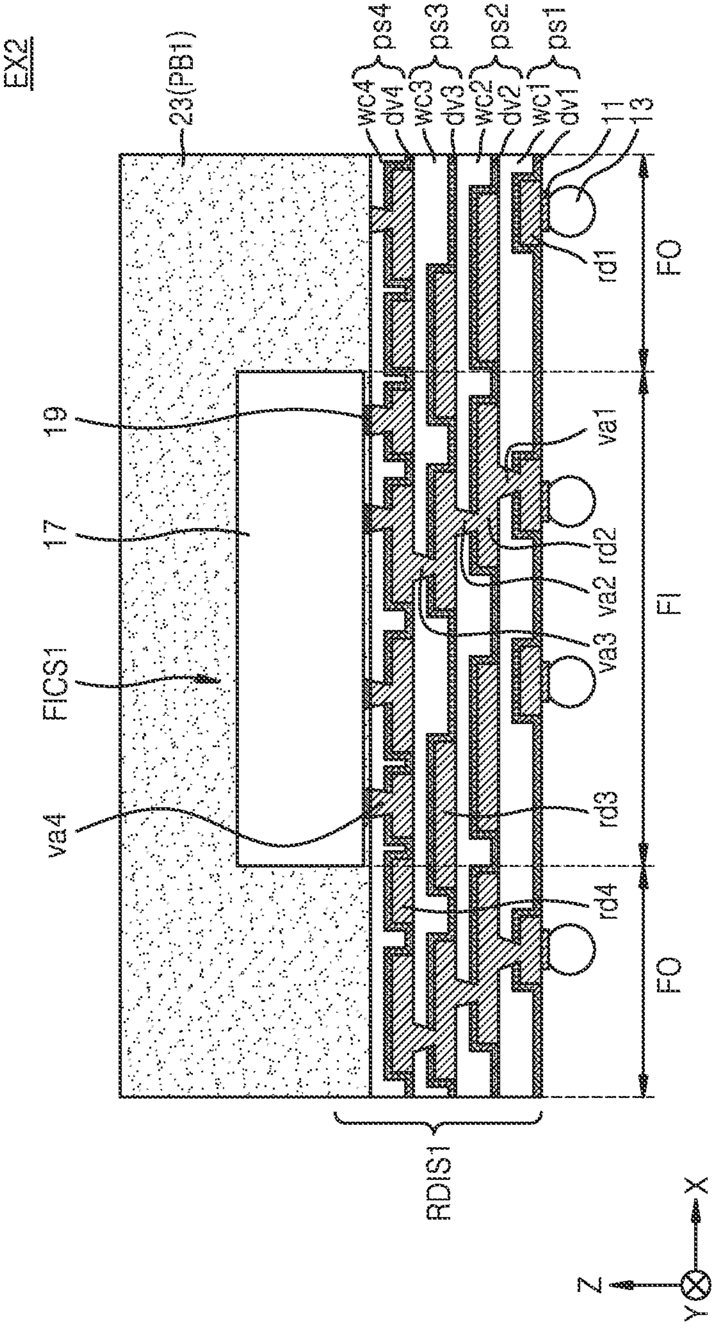

FIG. 5 is a cross-sectional view illustrating a first redistribution structure RDIS1 of a semiconductor package EX2 according to embodiments of the inventive concept.

The first redistribution structure RDIS1 of FIG. 5 is substantially similar to that of the first redistribution structure RDIS1 of FIG. 1, except that the internal connection terminal 21 is omitted and the chip pad 19 of the chip 17 is directly connected to the first redistribution structure RDIS1. For example, an uppermost one (e.g., fourth redistribution via va4) of the plurality of redistribution vias may be directly connected to the chip pad 19.

Figure 6:
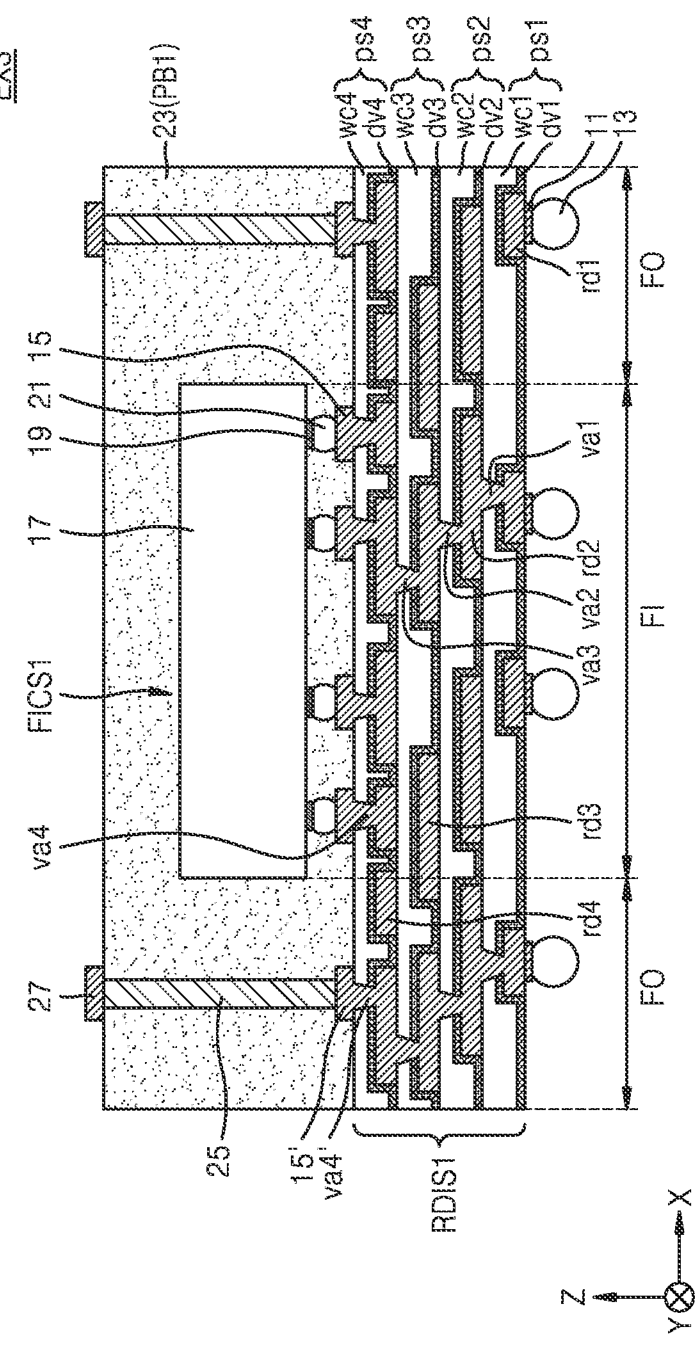

FIG. 6 is a cross-sectional view illustrating a first redistribution structure RDIS1 of a semiconductor package EX3 according to embodiments of the inventive concept.

The first redistribution structure RDIS1 of FIG. 6 is substantially similar to that of the first redistribution structure RDIS1 of FIG. 1, except for the addition of a body wiring structure 25 disposed within the encapsulation layer 23. Here, the body wiring structure 25 may extend through the encapsulation layer 23 between an uppermost one of the plurality of redistribution vias (e.g., redistribution va4') and a body wiring pad 27 disposed on an upper surface of the first package body PB1. In some embodiments, a second redistribution pad 15' may be disposed between the body wiring structure 25 and the uppermost one of the plurality of redistribution vias va4'.

In some embodiments, the body wiring structure 25 may be formed through the encapsulation layer 23 in the fan-out area FO, and may be a metal post (e.g., a copper post).

Further, an additional semiconductor package (not shown) may be vertically stacked on the body wiring pad 27 in order to electrically connect the first redistribution structure RDIS1 through the body wiring structure 25.

Figure 7:
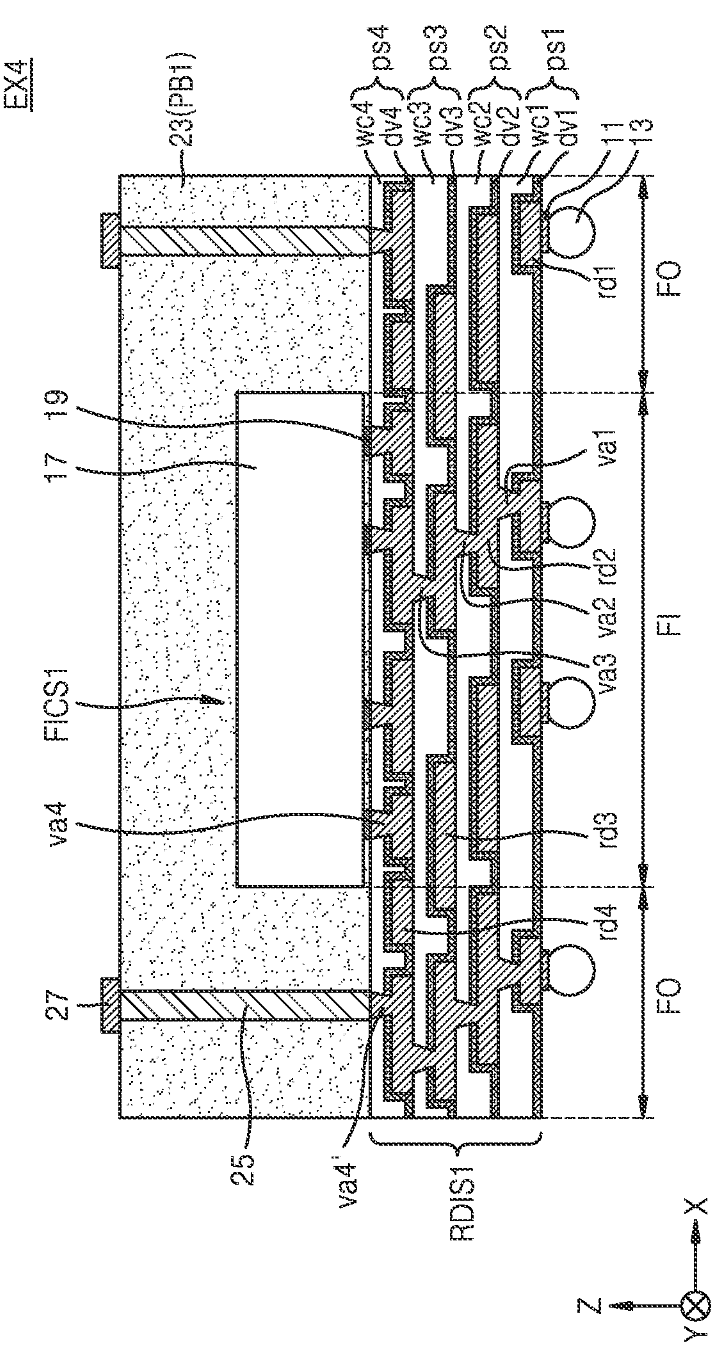

FIG. 7 is a cross-sectional view illustrating a first redistribution structure RDIS1 of a semiconductor package EX4 according to embodiments of the inventive concept.

The first redistribution structure RDIS1 of FIG. 7 is substantially similar to that of the first redistribution structure RDIS1 of FIG. 6, except that the internal connection terminal(s) 21 are omitted, and the chip pad(s) 19 of the chip 17 may be directly connected to the first redistribution structure RDIS1. For example, an uppermost ones of the plurality of redistribution vias (e.g., fourth redistribution via va4) may be used to directly connect to the chip pad(s) 19.

Figure 8:
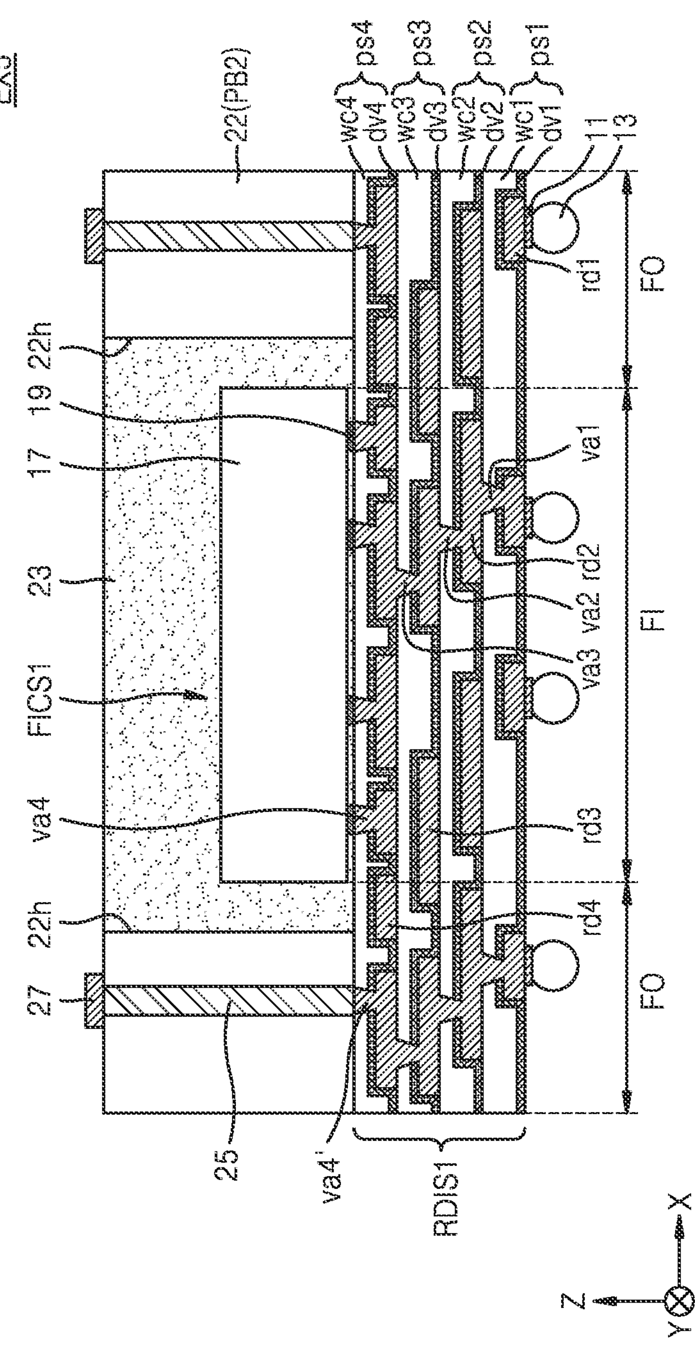

FIG. 8 is a cross-sectional view illustrating a first redistribution structure RDIS1 of a semiconductor package EX5 according to embodiments of the inventive concept.

The first redistribution structure RDIS1 of FIG. 8 is substantially similar to that of the first redistribution structure RDIS1 of FIG. 7, except for modifications to the first package body PB1 of FIG. 7 in order to form a second package body PB2. Here, the second package body 22 (PB2) may include both the encapsulation later 23 disposed in the fan-in area FI, and a semiconductor substrate 22 substantially formed in at least part of the fan-out area FO.

Hence, the body wiring structure 25 may be selectively formed through the semiconductor material 22.

The semiconductor substrate 22 may be formed from one or more semiconductor materials disposed (e.g.,) as an interposer substrate. For example, the semiconductor substrate 22 may include at least one of silicon, germanium (Ge), silicon carbide (SiC), gallium arsenide (GaAs), indium arsenide (InAs), and indium phosphate (InP).

Once the semiconductor material(s) have been formed on first rewiring structure RDIS1, and body penetrating hole 22*h* may be selectively formed in the semiconductor material(s) to exposed upper portions of the first rewiring structure RDIS1, and the chip 17 may be embedded within the body penetration hole 22*h* and connected to the exposed portions of the first rewiring structure RDIS1. Once connected, the chip 17 may be covered by the encapsulation layer 23.

Figure 9:
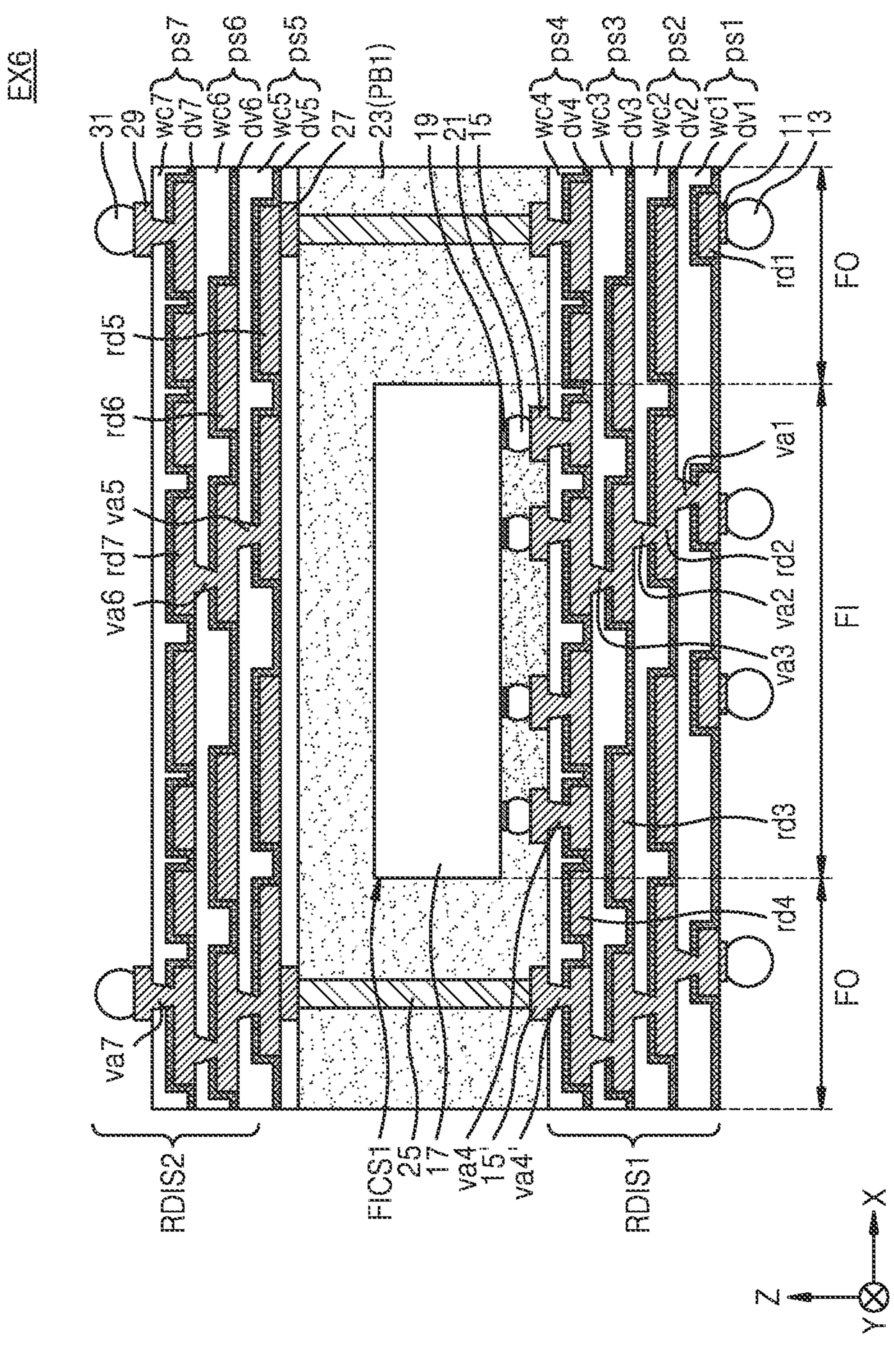

FIG. 9 is a cross-sectional view illustrating a semiconductor package EX6 according to embodiments of the inventive concept.

The embodiment of FIG. 9 is substantially similar to the embodiment of FIG. 7, except for the addition (e.g., vertical stacking) of a second redistribution structure RDIS2 on an upper surface of the first redistribution structure RDIS1. In some embodiments, the second redistribution structure RDIS2 may be electrically connected to the first redistribution structure RDIS1 through body wiring pad(s) 27. Alternately, the body wiring pad(s) 27 may be omitted and the second redistribution structure RDIS2 may be directly connected the body wiring structure 25.

The second redistribution structure RDIS2 may be substantially the same as the first redistribution structure RDIS1. Alternately, the second redistribution structure RDIS2 may be different from the first redistribution structure RDIS1. For example, the second redistribution structure RDIS2 may include three (3), vertically stacked redistribution layers rd5, rd6, and rd7, three (3) intervening passivation layers ps5, ps6, and ps7 respectively insulating the redistribution layers rd5, rd6, and rd7, and three (3) redistribution vias va5, va6, and va7 electrically connecting the redistribution layers rd5, rd6, and rd7 through the passivation layers ps5, ps6, and ps7.

In this regard, the first redistribution structure RDIS1 may be referred to as a lower redistribution structure, the redistribution layers rd1, rd2, rd3, and rd4 may be referred to as lower redistribution layers, the passivation layers ps1, ps2, ps3, and ps4 may be referred to as lower passivation layers, and the redistribution vias va1, va2, va3, and va4 may be referred to as lower redistribution vias. Accordingly, the second redistribution structure RDIS2 may be referred to as an upper redistribution structure, the redistribution layers rd5, rd6, and rd7 may be referred to as upper redistribution layers, the passivation layers ps5, ps6, and ps7 may be referred to as upper passivation layers, and the redistribution vias va5, va6, and va7 may be referred to as upper redistribution vias.

In some embodiments, an uppermost redistribution via (e.g., redistribution via va7) may serve as an external connection redistribution via. A third redistribution pad 29 may be connected to the uppermost redistribution via, and a second external connection terminal 31 may be connected to the third redistribution pad 29.

Figure 10:
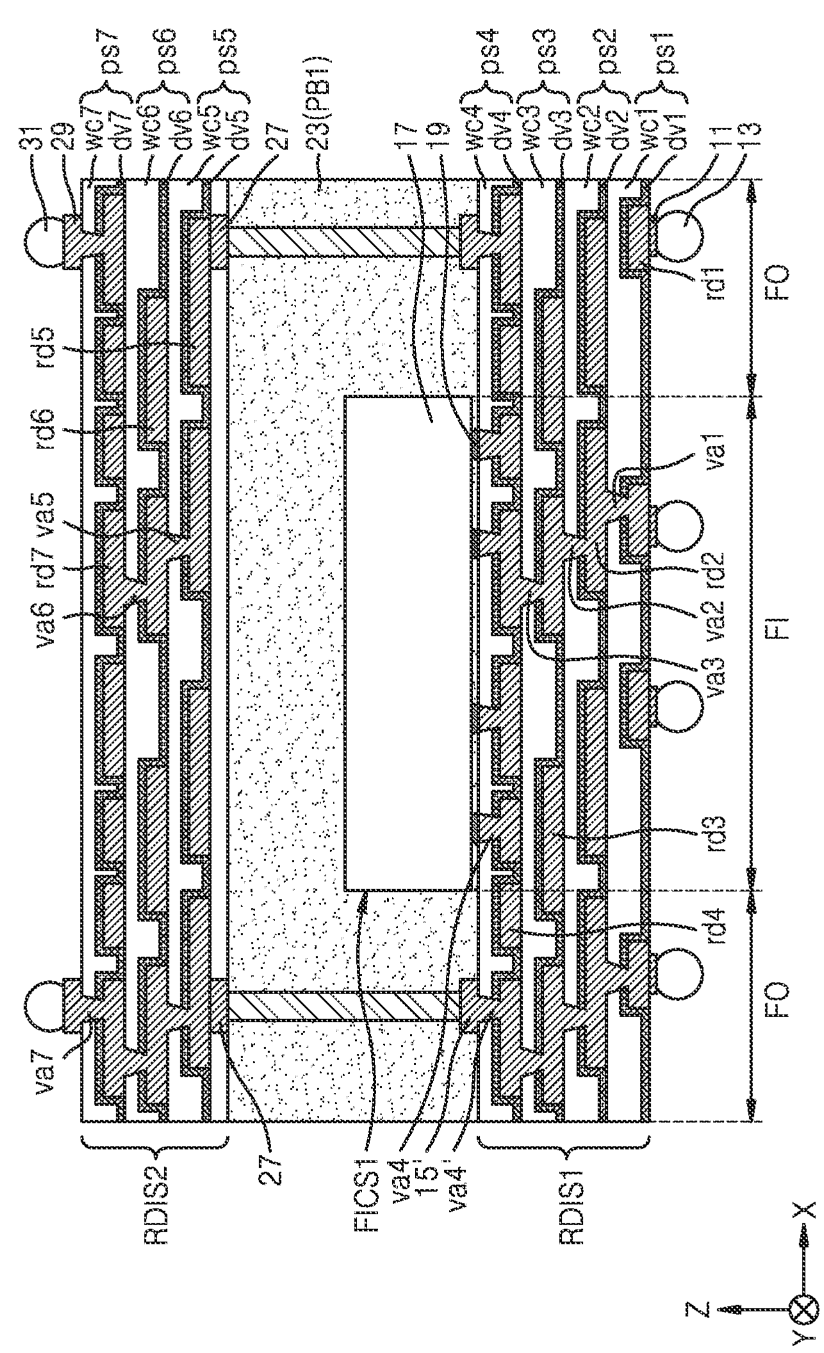

FIG. 10 is a cross-sectional view illustrating a semiconductor package EX7 according to embodiments of the inventive concept.

Here, the semiconductor package EX7 of FIG. 10 is substantially similar to the semiconductor package EX6 of FIG. 9, except that the internal connection terminal(s) 21 are omitted, and the chip pad(s) 19 of the chip 17 are directly connected to the first redistribution structure RDIS1. For example, uppermost ones of the plurality of redistribution vias (e.g., fourth redistribution via va4) may be used to directly connect the chip pad(s) 19.

Figure 11:
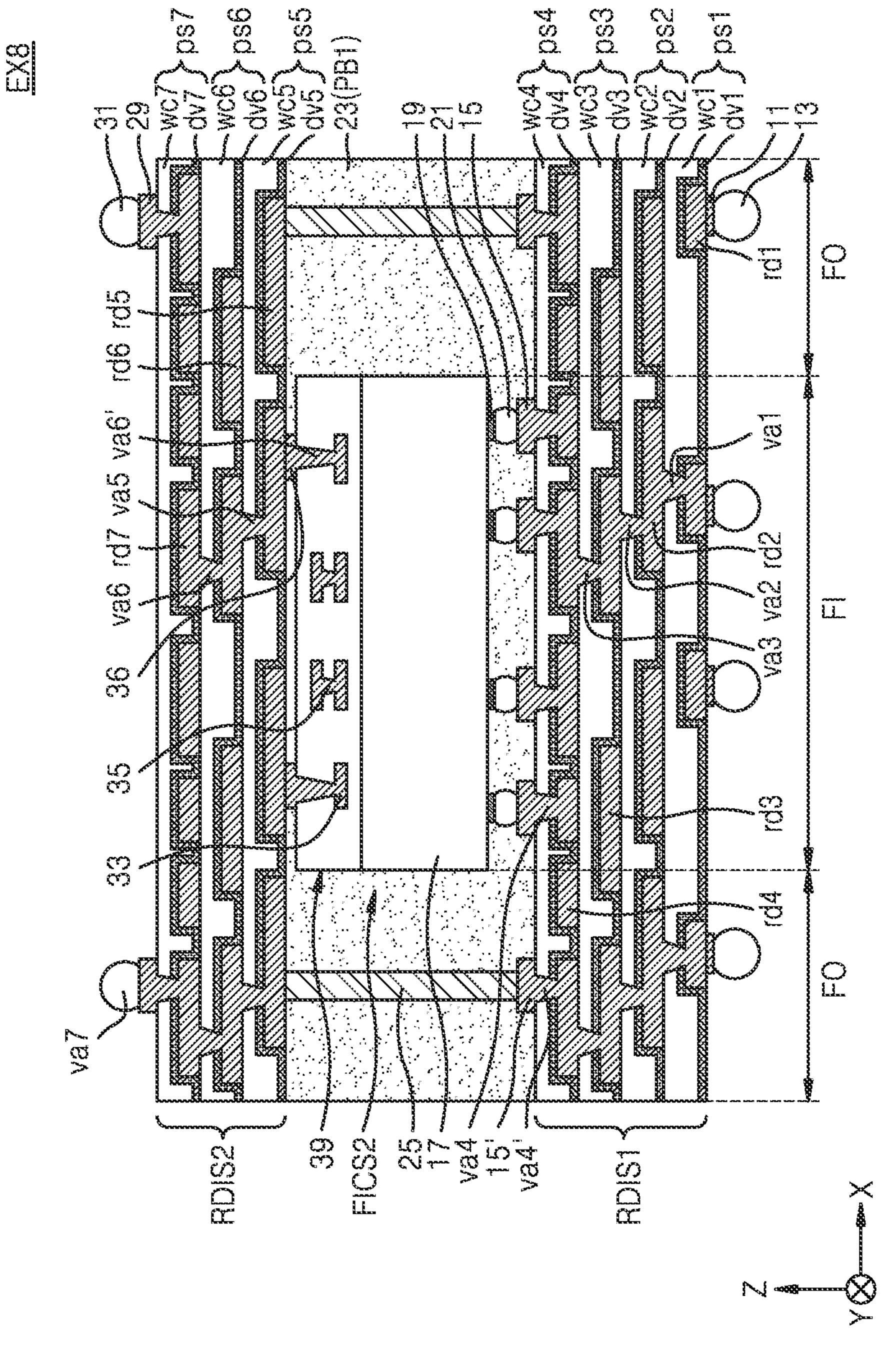

FIG. 11 is a cross-sectional view illustrating a semiconductor package EX8 according to embodiments of the inventive concept.

Here, the semiconductor package EX8 of FIG. 11 is substantially similar to the semiconductor package EX7 of FIG. 10, except for the addition of a chip wiring structure 39 electrically connected to the second redistribution structure RDIS2 above the chip 17. Further, the second redistribution structure RDIS2 is directly connected to the body wiring structure 25 without use of the body wiring pad(s) 27.

As shown in FIG. 11, the chip wiring structure 39 may include a chip wiring layer 33, a chip wiring via layer 35, and a chip wiring pad 36. Accordingly, a fan-in chip structure FICS2 including a chip 17 and a chip wiring structure 39 may be disposed in the fan-in area FI.

The second redistribution structure RDIS2 may be disposed on the chip wiring structure 39 and the encapsulation layer 23.

Here, the second redistribution structure RDIS2 may substantially the same as the first redistribution structure RDIS1, but alternately, the second redistribution structure RDIS2 may different from the first redistribution structure RDIS1.

For example, the second redistribution structure RDIS2 may include redistribution layers rd5, rd6, and rd7, wherein the fifth redistribution layer rd5 is a lowermost redistribution layer serving as a chip connection. That is, the fifth rewiring layer rd5 may be electrically connected to the chip wiring pad 36 of the chip wiring structure 39.

Figure 12:
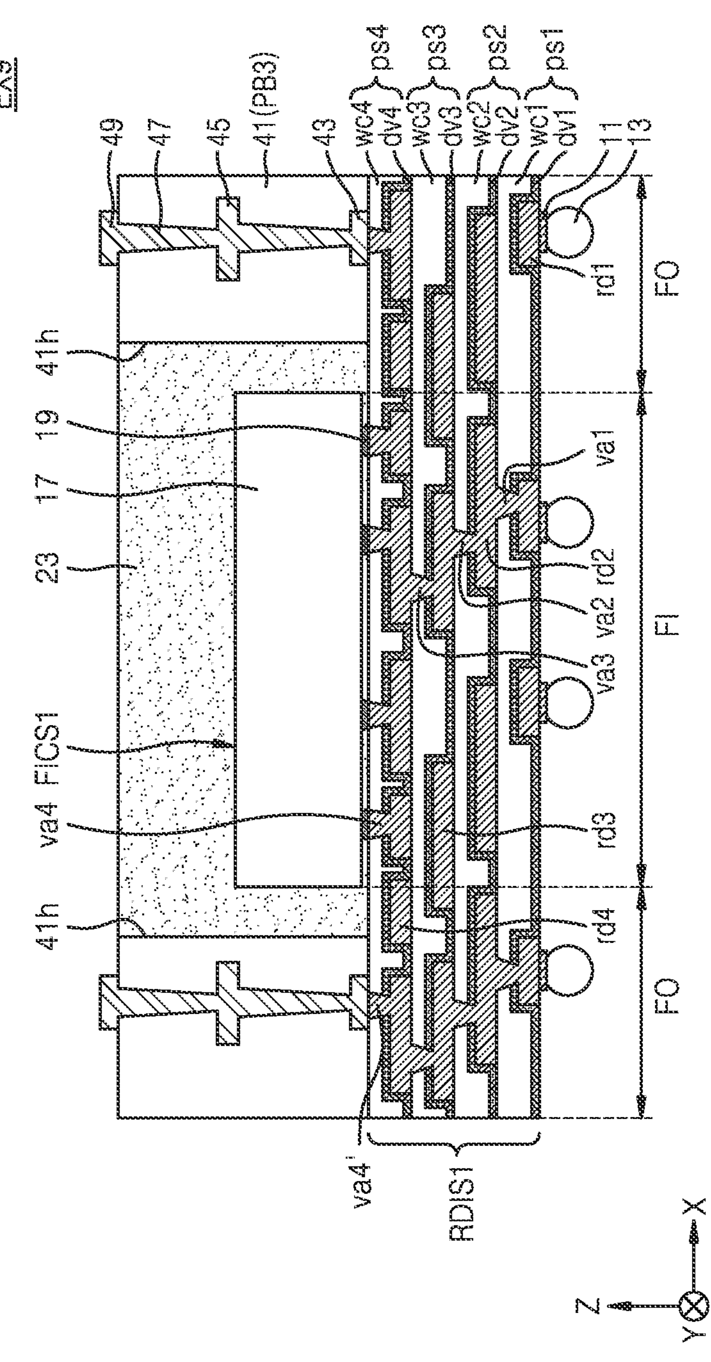

FIG. 12 is a cross-sectional view illustrating a first redistribution structure RDIS1 of a semiconductor package EX9 according to embodiments of the inventive concept.

The first redistribution structure RDIS1 of FIG. 12 is substantially similar to that of the first redistribution structure RDIS1 of FIG. 8, except that a third package body PD3 (or wiring substrate 41) replaces the second package body PD2 including the body wiring structure 25. Here, the wiring substrate 41 may be variously implemented as a semiconductor substrate, an insulating layer, a frame substrate and/or a printed circuit board) in the fan-out area(s) FO of the semiconductor package. In some embodiments, at least a portion of the wiring substrate 41 may extend into a body penetration hole 41*h* formed in the third package body PB3. That is, at least a portion of the fan-in chip structure FICS1 may be embedded in the body penetration hole 41*h*. Thus, the semiconductor package EX9 of FIG. 12 may be a fan out panel level package (FOPLP).

The wiring substrate 41 may include at least one material, such as for example, phenol resin, epoxy resin, polyimide, etc. For example, the wiring substrate 41 may include at least one material, such as for example, frame retardant 4 (FR4), tetrafunctional epoxy, polyphenylene ether, epoxy/polyphenylene oxide, bismaleimide triazine (BT), Thermount, Cyanate ester, polyimide and liquid crystal polymer.

The chip 17 may be embedded in the body penetration hole 41*h* and sealed by the encapsulation layer 23. Body redistribution structures 45 and 47 may be electrically connected to the first redistribution structure RDIS1 through the wiring substrate 41.

That is, the wiring structure 41 may include body wiring layers 45 and body vias 47 variously connecting the body wiring layer 45, wherein the body wiring structures 45 and 47 may be variously connect between lower body wiring pad(s) 43 and upper body wiring pad(s) 49.

Each of the body wiring layer 45, the body via 47, and the body wiring pads 43 and 49 may include a metal. For example, the body wiring layer 45 and the body wiring pads 43 and 49 may include electrolytically deposited (ED) copper foil, rolled-annealed (RA) copper foil, stainless steel foil, aluminum foil, ultra-thin copper foil, sputtered copper, copper alloys, etc. The body via 47 may include for example, copper, nickel, stainless steel, and beryllium copper.

Figure 13:
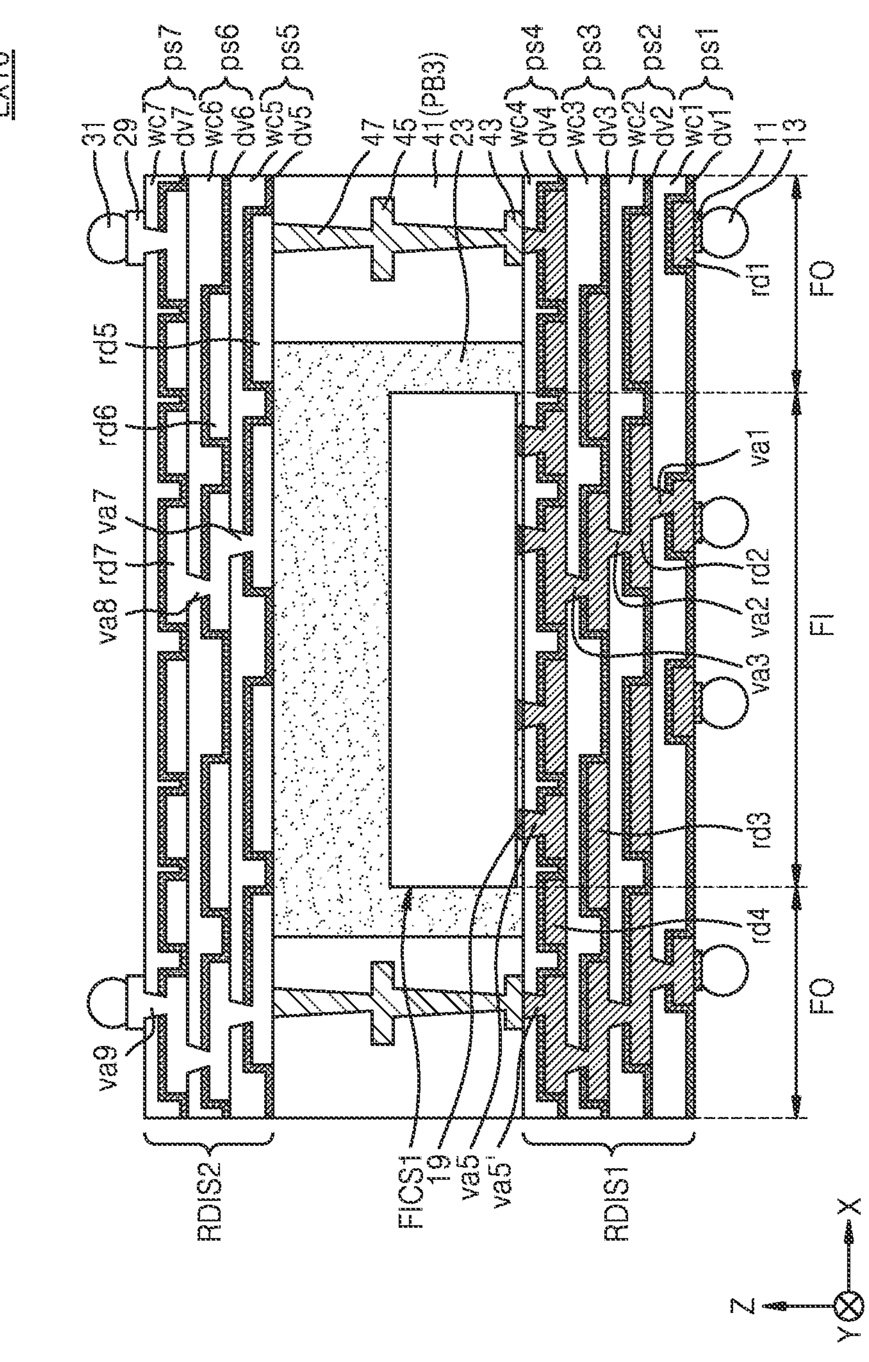

FIG. 13 is a cross-sectional view illustrating a semiconductor package EX10 according to embodiments of the inventive concept.

Here, the semiconductor package EX10 of FIG. 13 is substantially similar to the semiconductor package EX9 of FIG. 12, except for the addition of the second redistribution structure RDIS2, wherein the second redistribution structure RDIS2 may be configured in the same manner as the second redistribution structure RDIS2 of FIG. 11.

Figure 14:
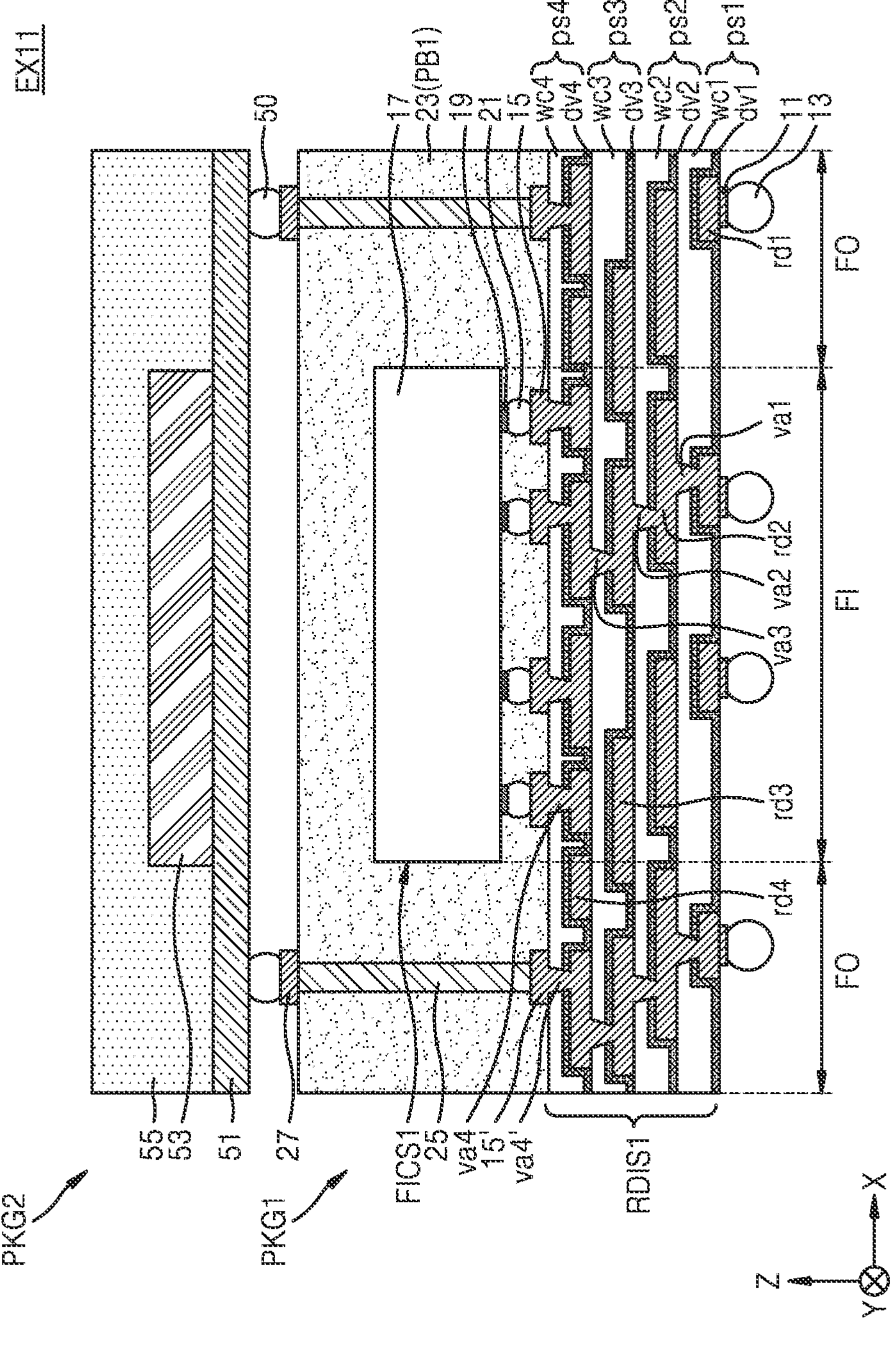

FIG. 14 is a cross-sectional view illustrating a semiconductor package EX11 according to embodiments of the inventive concept.

Here, the semiconductor package EX11 is substantially similar to the semiconductor package EX3 of FIG. 6, except for the addition of a vertically stacked upper package PKG2.

Thus, the semiconductor package EX11 of FIG. 14 includes a lower package PKG1 and an upper package PKG2 vertically stacked on the lower package PKG1 using third external connection terminal(s) 50 disposed on the body wiring pad(s) 27 of the lower package PKG1.

The upper package PKG2 may include an upper chip 53 attached to an upper wiring substrate 51, wherein the upper wiring substrate 51 and the upper chip 53 may be electrically connected through bonding wire(s) and/or bump(s). The upper chip 53 may be a memory chip, as described above.

The upper package PKG2 may include an upper encapsulation layer 55 substantially surrounding the upper chip 53, wherein the upper encapsulation layer 55 may include, for example, an EMC. Although the upper encapsulation layer 55 is illustrated as covering an upper (inactive) surface of the upper chip 53, the disposition of the upper encapsulation layer 55 is not limited thereto.

Figure 15:
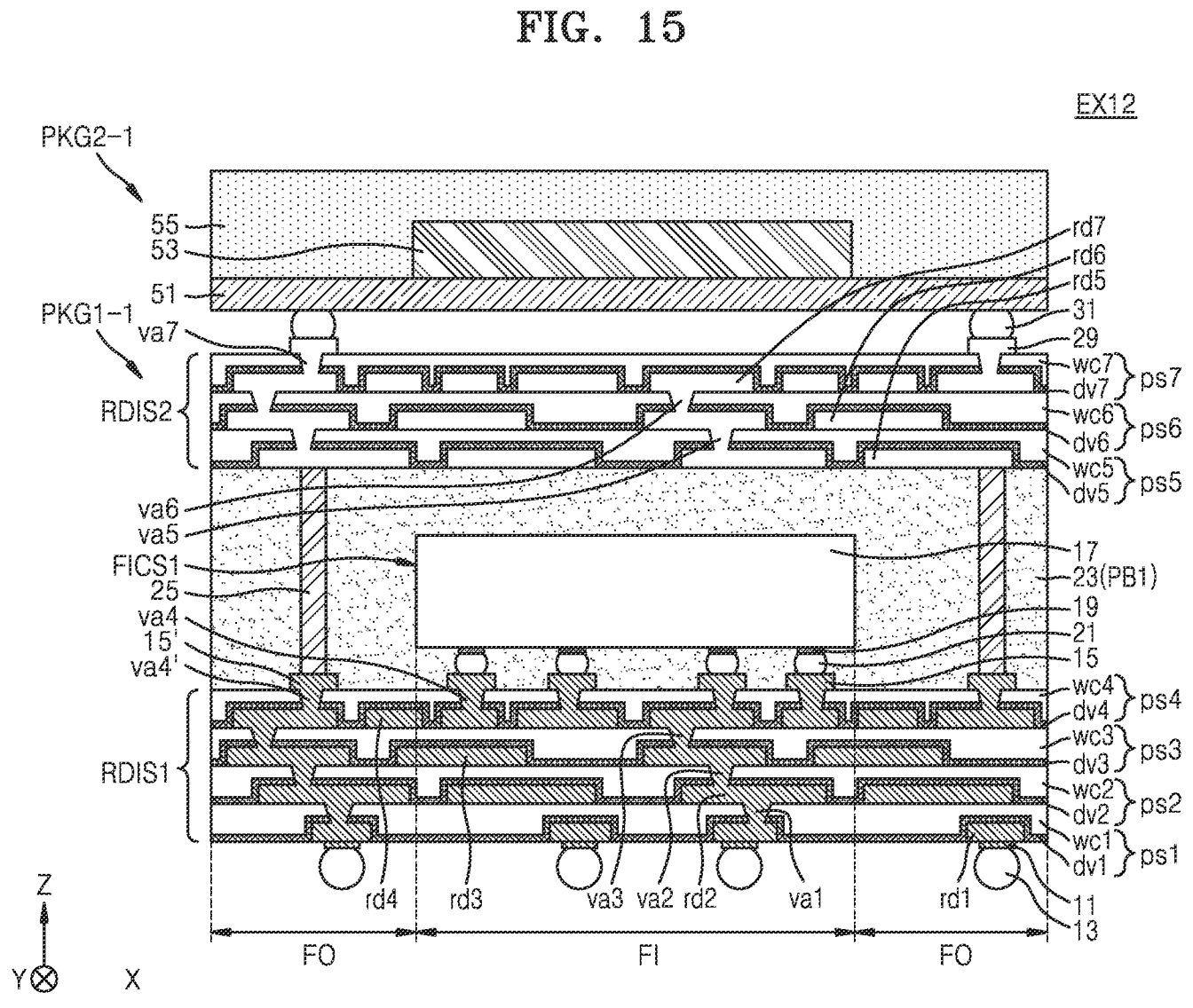

FIG. 15 is a cross-sectional view illustrating a semiconductor package EX12 according to embodiments of the inventive concept.

Here, the semiconductor package EX12 of FIG. 15 is substantially similar to the semiconductor package EX8 of FIG. 11, except for the addition of the upper package PKG2-1 in a manner similar to the semiconductor package EX11 of FIG. 14.

From the foregoing examples, those skilled in the art will appreciate that many different semiconductor packages may be variously configured and yet fall within the scope of the inventive concept.

FIGS. 16A to 16H are related cross-sectional views illustrating in one example a method of manufacturing a first redistribution structure for a semiconductor package according to embodiments of the inventive concept.

Figure 16A:
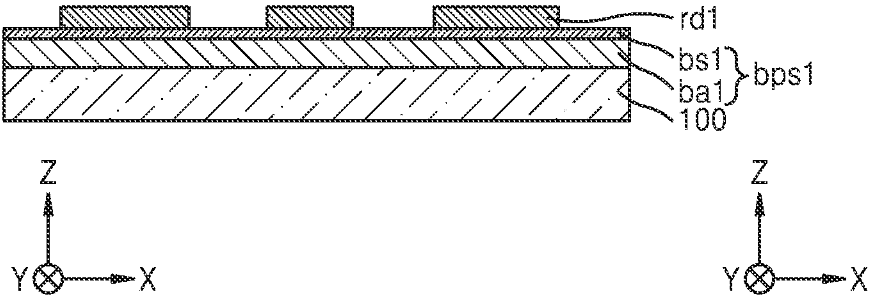
FIGS. 16A, 16B, 16C, 16D, 16E, 16F, 16G and 16H (hereafter collectively, "FIGS. 16A to 16H") are related cross-sectional views illustrating in one example a method of manufacturing the first redistribution structure according to embodiments of the inventive concept.

Referring to FIG. 16A, a base layer ba1 and a base support layer bs1 are sequentially formed on a carrier substrate 100. The carrier substrate 100 may include a glass substrate. The base layer ba1 and the base support layer bs1 constitute a base passivation layer bps1. The base layer ba1 may include a PID layer. The base support layer bs1 may include a metal layer, for example, a titanium layer.

Subsequently, a first redistribution layer rd1 is formed on the base support layer bs1. The first redistribution layer rd1 may include a metal layer, for example, a copper layer. The first redistribution layer rd1 may include a plurality of first redistribution patterns spaced apart from each other in a horizontal direction (X direction).

Figure 16B:
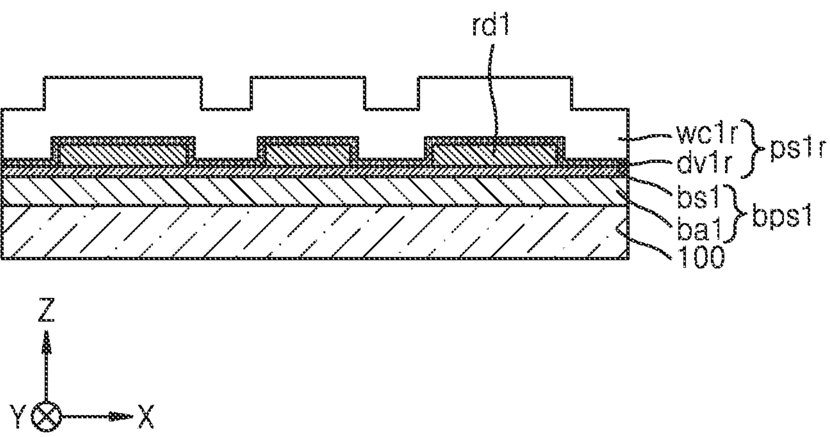

Referring to FIG. 16B, a first passivation material layer ps1*r* is formed on the first redistribution layer rd1. The first passivation material layer ps1*r* includes a first diffusion barrier material layer dv1*r* covering the first redistribution layer rd1 and a first warpage control material layer wc1*r* formed on the first diffusion barrier material layer dv1*r*.

In some embodiments, the first diffusion barrier material layer dv1*r* and the first warpage control material layer wc1*r* may be formed using a chemical vapor deposition process at low temperature (e.g., a process temperature of about 200° C. or less). In some embodiments, the first diffusion barrier material layer dv1*r* and the first warpage control material layer wc1*r* may be formed using a chemical vapor deposition process at low temperature (e.g., a process temperature ranging from about 150° C. to about 200° C.).

When the first diffusion barrier material layer dv1*r* and the first warpage control material layer wc1*r* are formed at low temperature (e.g., about 200° C. or less) notably lower than a melting point temperature (e.g., 270° C.) for the carrier substrate 100 (e.g., a glass substrate), thereby preventing possible damage to the carrier substrate 100. In some embodiments, the first diffusion barrier material layer dv1*r* and the first warpage regulatory material layer wc1*r* may be formed using an in-situ method performed in a chemical vapor deposition chamber.

The first diffusion barrier material layer dv1*r* may include a silicon nitride layer (e.g., a SiN layer or a $Si_3N_4$ layer). Hence, the first diffusion barrier material layer dv1*r* inhibits diffusion of metal from the first redistribution layer rd1 (e.g., copper). The first diffusion barrier material layer dv1*r* may be formed to a thickness of several thousand □ (e.g., between about 3000 □ to about 7000 □).

The first warpage control material layer wc1*r* may be formed to be thicker than the first diffusion barrier material layer dv1*r*. The first warpage control material layer wc1*r* may be formed to sufficiently cover the first redistribution layer rd1. The first warpage control material layer wc1*r* may be formed to sufficiently cover the first redistribution patterns constituting the first redistribution layer rd1.

The first warpage control material layer wc1*r* may includes a silicon oxide layer (e.g., a $SiO_2$ layer). The first warpage control material layer wc1*r* may be formed to a thickness of several tens of thousands of □ (e.g., between about 30,000 □ and about 60,000 □. The first warpage control material layer wc1*r* may serve to adjust (or compensate for) warpage of an semiconductor package according to embodiments of the inventive concept.

Figure 16C:
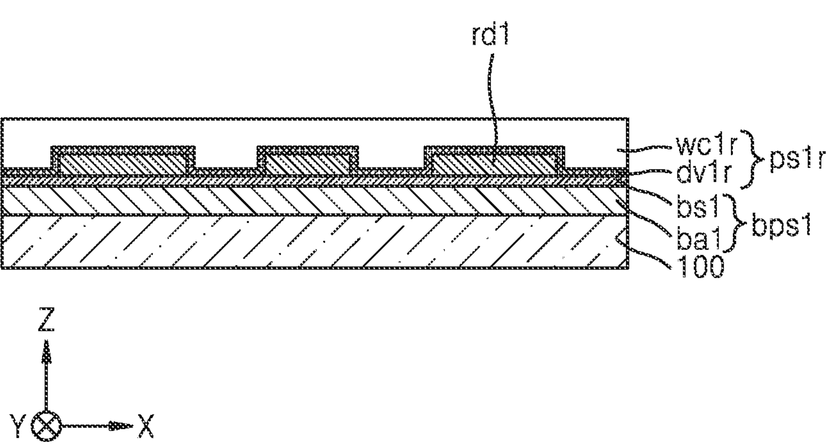

Referring to FIG. 16*c*, the surface of the first warpage control material layer wc1*r* is chemically mechanically polished to form a planarized first warpage control material layer wc1*r*. The first passivation material layer ps1*r* may include the first redistribution layer rd1 and the planarized first warpage control material layer wc1*r*. The remaining planarized first warpage control material layer wc1*r* may have a thickness of several tens of □ (e.g., between about 20,000 □ to about 50,000 □).

The planarized first warpage control material layer wc1*r* may be formed on the first diffusion barrier material layer dv1*r* and may be buried between the first redistribution patterns constituting the first redistribution layer rd1.

Figure 16D:
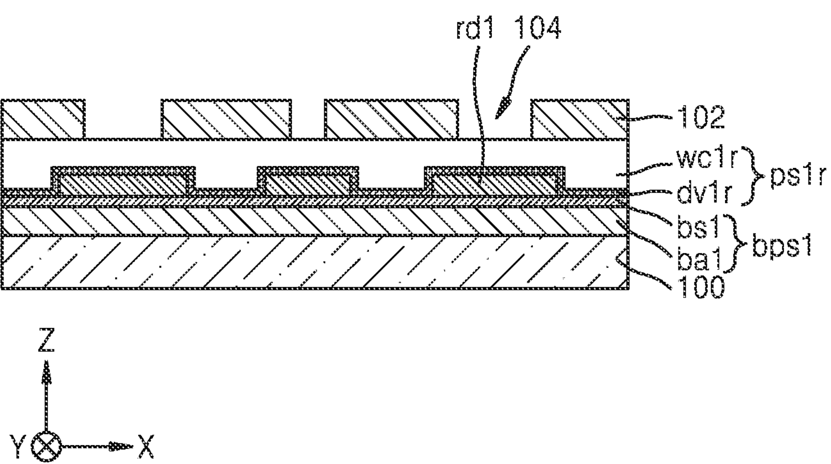

Referring to FIG. 16D, a first photoresist pattern 102 is formed on the first passivation material layer ps1*r*. The first photoresist pattern 102 with a contact hole 104 exposing an upper portion of the first redistribution layer rd1 is formed on the first passivation material layer ps1*r*. The first photoresist pattern 102 is formed using a photolithography process.

Figure 16E:
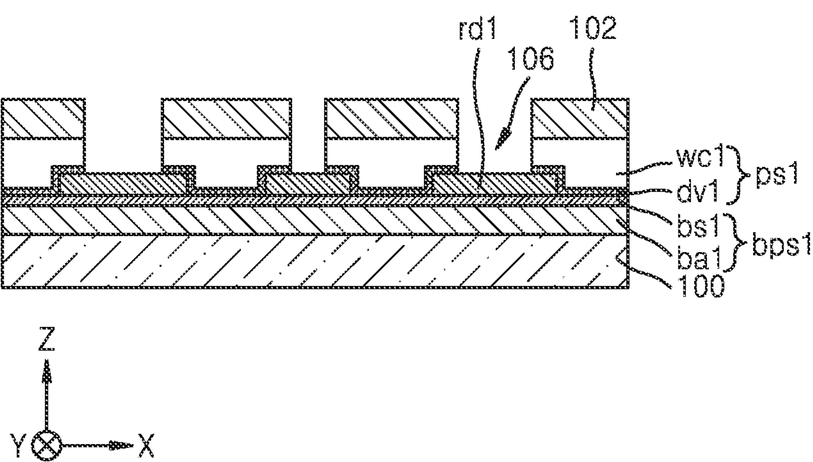

Referring to FIG. 16E, the first warpage control material layer wc1*r* (of FIG. 16D) which has been planarized, and the first diffusion barrier material layer dv1*r* (of FIG. 16D), are selectively etched by using the first photoresist pattern 102 as an etching mask.

Accordingly, a first warpage control layer wc1 and a first diffusion barrier layer dv1, which have a via hole 106, are formed on the first redistribution layer rd1. The via hole 106 may be a hole exposing an upper portion of the first redistribution layer rd1.

Figure 16F:
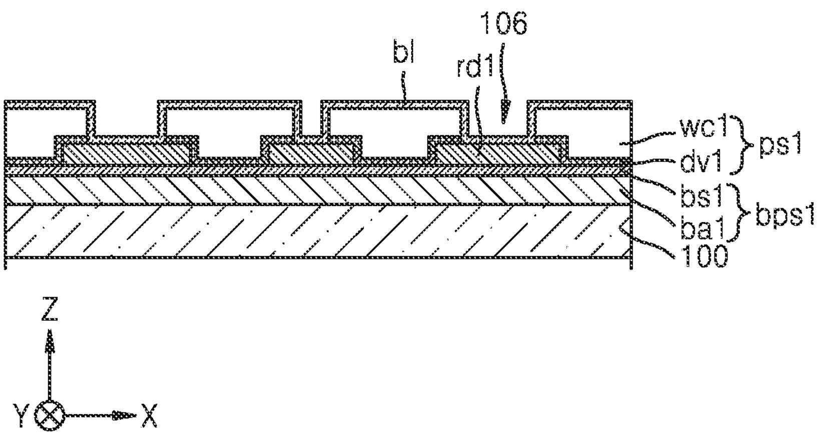

Referring to FIG. 16F, the first photoresist pattern 102 (of FIG. 16E) is removed. Subsequently, a barrier metal material layer b1 is formed on the bottom and both side walls of the via hole 106 on the first redistribution layer rd1 and the first warpage control layer wc1. The barrier metal material layer b1 may be formed of Ti, Ta, or the like.

Figure 16G:
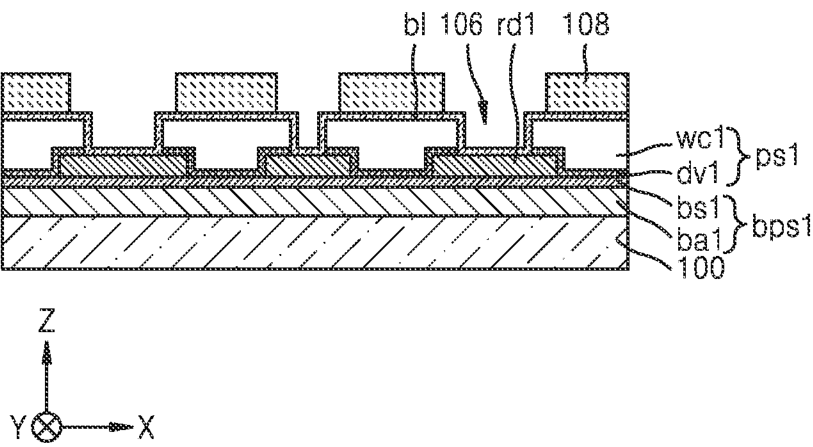

Referring to FIG. 16G, a second photoresist pattern 108 is formed on the barrier metal material layer b1 on the first warpage control layer wc1 to expose an upper portion of the via hole 106. The second photoresist pattern 108 is formed to expose the barrier metal material layer b1 formed on the via hole 106. The second photoresist pattern 108 is formed using a photolithography process.

Figure 16H:
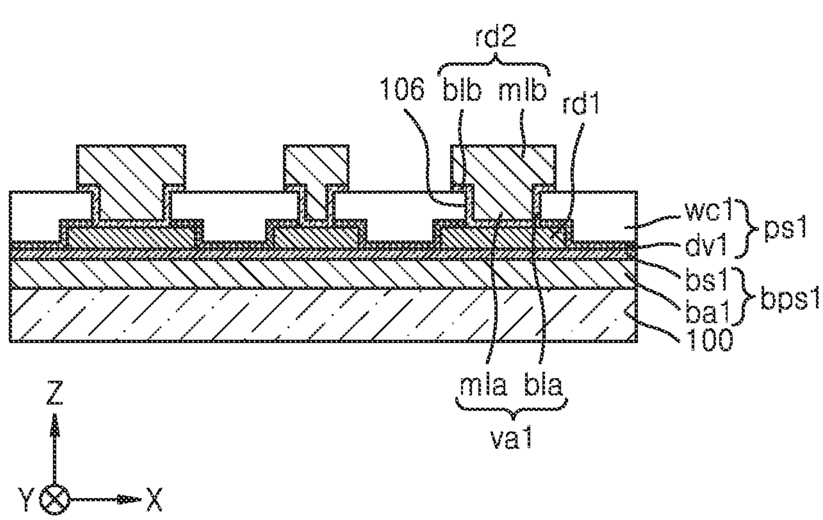

Referring to FIG. 16H, a second redistribution via va2 and a second redistribution layer rd2 are formed on the first waste paper control layer wc1 except for the upper portion of the barrier metal material layer b1 (of FIG. 16F) in the via hole 106 and the second photoresist pattern 108 (of FIG. 16G). When the second redistribution via va2 and the second redistribution layer rd2 are formed, a process of forming a seed metal layer may be included, but will be omitted herein.

Subsequently, the second photoresist pattern 108 (of FIG. 16G) is removed. During the removal of the second photoresist pattern 108 (of FIG. 16G), the barrier metal material layer b1 (of FIG. 16F) on the first warpage control layer wc1 may be removed.

Accordingly, the first redistribution via va1 may include a first barrier metal layer b1*a* and a first redistribution via metal layer m1*a*. The second redistribution layer rd2 may include a second barrier metal layer b1*b* and a second redistribution metal layer m1*b*. The first barrier metal layer b1*a* and a second barrier metal layer b1*b* may be formed by patterning the barrier metal material layer b1. The first redistribution via metal layer m1*a* and the second redistribution metal layer m1*b* may be copper layers. Subsequently, the carrier substrate 100 and the base passivation layer bps1 may be removed to form a first redistribution structure.

Figure 17:
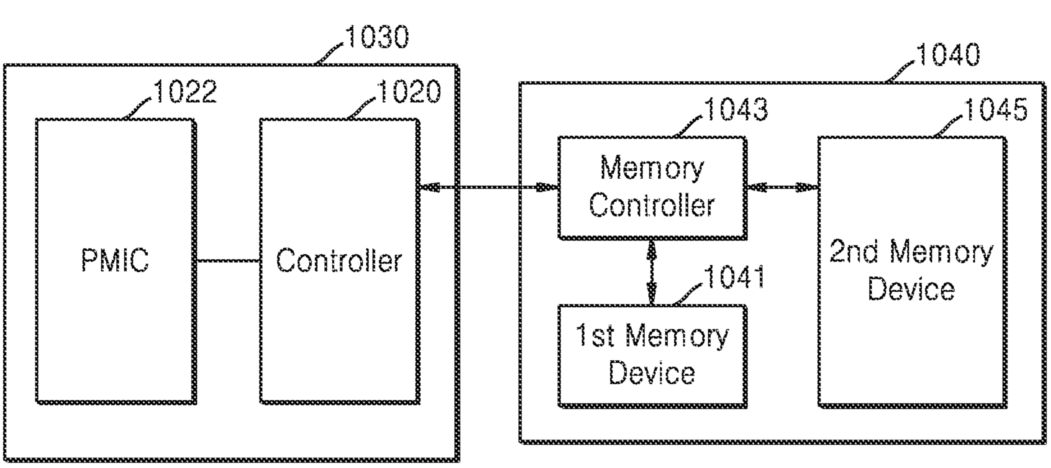
FIG. 17 is a block diagram illustrating one possible structure of a semiconductor package according to embodiments of the inventive concept.

FIG. 17 is a block diagram illustrating one possible structure for a semiconductor package 1000 according to embodiments of the inventive concept.

Here, the semiconductor package 1000 may correspond to, for example the semiconductor package EX11 or EX12 described above. In this regard, the semiconductor package 1000 may include a controller chip 1020, a first memory chip 1041, a second memory chip 1045, and a memory controller 1043. The semiconductor package 1000 may further include a PMIC 1022 for supplying current of an operating voltage to each of the controller chip 1020, the first memory chip 1041, the second memory chip 1045, and the memory controller 1043, where respective operating voltage(s) may vary by design.

A lower package 1030 may include the controller chip 1020 and the PMIC 1022 may be the lower package PKG1 or PKG1-1 described above. An upper package 1040 including the first memory chip 1041, the second memory chip 1045, and the memory controller 1043 may be the upper package PKG2 or PKG2-1 as described above.

The semiconductor package 1000 may be implemented as a personal computer (PC) or a mobile device. The mobile device may be implemented as a laptop computer, a mobile phone, a smart phone, a tablet PC wallet, a personal digital assistant (PDA), an enterprise digital assistant (EDA), a digital still camera, a digital video camera, a portable multimedia player (PMP), a personal navigation device or a portable navigation device (PND), a handheld game console, a mobile internet device (MID), a wearable computer, an Internet of Things (IoT) device, an Internet of Everything (IoE) device, or a drone.

The controller chip 1020 may control operations of each of the first memory chip 1041, the second memory chip 1045, and the memory controller 1043. For example, the controller chip 1020 may be implemented as an integrated circuit (IC), a system on chip (SoC), an AP, a mobile AP, a chipset, or a set of chips. The controller chip 1020 may include a CPU, a graphics processing unit (GPU), and/or a modem. In some embodiments, the controller chip 1020 may perform the modem function and the AP function.

The memory controller 1043 may control the second memory chip 1045 under the control of the controller chip 1020. The first memory chip 1041 may be implemented as a volatile memory device. The volatile memory device may be implemented as a DRAM or a SRAM, but are not limited thereto. The first memory chip 1045 may be implemented as a storage memory device. The storage memory device may be implemented as a nonvolatile memory device.

The storage memory device may be implemented as a flash-based memory device, but is not limited thereto. The second memory chip 1045 may be implemented as a NAND-type flash memory device. The NAND-type flash memory device may include a two-dimensional memory cell array or a three-dimensional memory cell array. The two-dimensional memory cell array or the three-dimensional memory cell array may include a plurality of memory cells, and each of the plurality of memory cells may store 1-bit information or 2-or-more-bit information.

When the second memory chip 1045 is implemented as a flash-based memory device, the memory controller 1043 may use (or support) a multimedia card (MMC) interface, an embedded MMC (eMMC) interface, or a universal flash storage (UFS) interface, but embodiments are not limited thereto.

Figure 18:
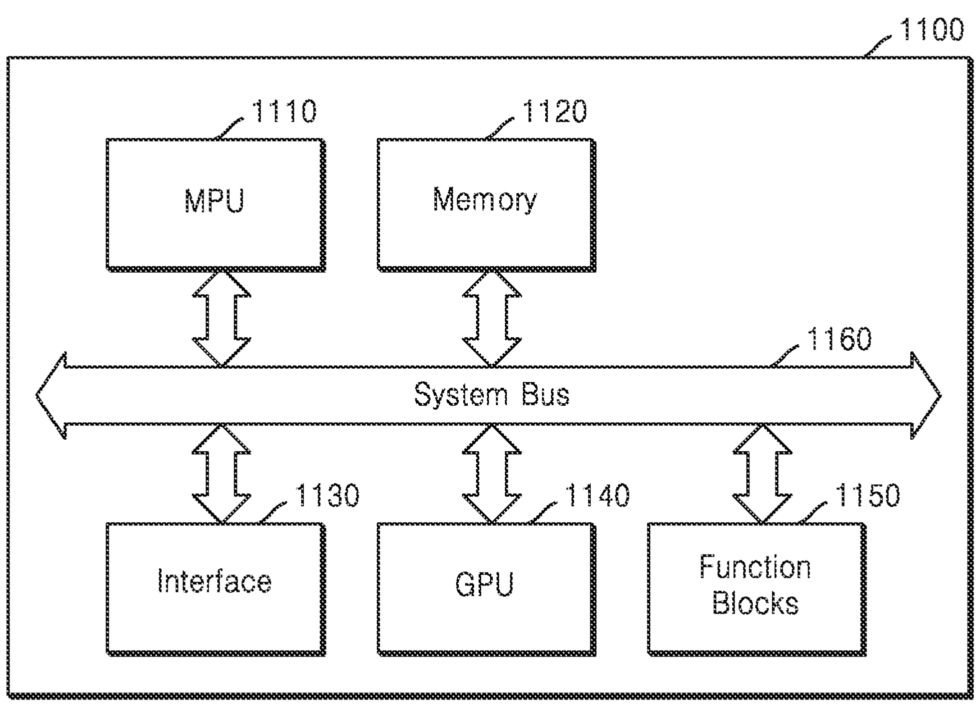
FIG. 18 is a block diagram illustrating another possible structure of a semiconductor package according to embodiments of the inventive concept.

FIG. 18 is a block diagram illustrating another possible structure for a semiconductor 1100 package according to embodiments of the inventive concept.

Here, the semiconductor package 1100 may include a micro-processing unit 1110, a memory 1120, an interface 1130, a GPU 1140, function blocks 1150, and a bus 1160 connecting the same. The semiconductor package 1100 may include both the micro-processing unit 1110 and the GPU 1140, but may include only one of them.

The micro-processing unit 1110 may include a core and an L2 cache. For example, the micro-processing unit 1110 may include a multi-core. Each core of the multi-core may have the same or different performance. In addition, each core of the multi-core may be activated at the same time or may be activated at different times. The memory 1120 may store a processing result or the like by the function blocks 1150 under the control of the micro-processing unit 1110. For example, content stored in the L2 cache of the micro-processing unit 1110 is flushed to be stored in the memory 1120. The interface 1130 may perform an interface with external devices. For example, the interface 1130 may perform an interface with a camera, an LCD, a speaker, and the like.

The graphics processing unit 1140 may perform graphics functions. For example, the GPU 1140 may perform a video codec or process 3D graphics. The function blocks 1150 may perform various functions. For example, when the semiconductor package 1100 is an AP used in a mobile device, some of the function blocks 1150 may perform a communication function.

The semiconductor package 1100 may be one of the semiconductor packages EX11 and EX12 described above. The micro-processing unit 1110 and/or the GPU 1140 may be the lower packages PKG1 and PKG1-1 described above. The memory 1120 may be one of the upper packages PKG2 and PKG2-1 described above. The interface 1130 and the function blocks 1150 may correspond to portions of a lower package PKG1 and PKG1-1 as described above.

While the inventive concept has been particularly shown and described with reference to certain illustrated embodiments, it will be understood that various changes in form and details may be made therein without departing from the scope of the following claims.

What is claimed is:

1. A semiconductor package comprising:

a first redistribution structure;

a chip disposed on the first redistribution structure; and a package body disposed on the first redistribution structure and covering opposing side surfaces of the chip, wherein the first redistribution structure includes:

a vertically stacked plurality of redistribution layers;

a respectively intervening plurality of passivation layers insulating the plurality of redistribution layers; and a plurality of redistribution vias penetrating the plurality of passivation layers to electrically connect redistribution layers among the plurality of redistribution layers, wherein each passivation layer among the plurality of passivation layers includes a diffusion barrier layer on a corresponding redistribution layer among the plurality of redistribution layers, and a warpage control layer on the diffusion barrier layer, wherein the diffusion barrier layer and the warpage control layer are electrically insulating, wherein a thickness of the warpage control layer is greater than a thickness of the diffusion barrier layer, wherein each of the plurality of redistribution layers comprises a plurality of redistribution patterns horizontally spaced apart from each other, and the diffusion barrier layer covers side surfaces of the plurality of redistribution patterns and is between the plurality of redistribution patterns, wherein at least one of the plurality of redistribution layers is a base passivation layer including a base layer and a base support layer disposed on the base layer, and the base passivation layer is disposed between two redistribution layers among the plurality of redistribution layers.

2. The semiconductor package of claim 1, wherein the package body includes:

an encapsulation layer; and a body wiring structure extending through the encapsulation layer to electrically connect the first redistribution structure.

3. The semiconductor package of claim 1, wherein the package body includes:

a substrate including a body penetration hole selectively exposing an upper surface of the first redistribution structure, wherein the substrate includes at least one of a semiconductor material.

4. The semiconductor package of claim 1, wherein the package body includes:

a substrate including a body penetration hole selectively exposing a portion of an upper surface of the first redistribution structure; and a body wiring structure extending through the substrate to electrically connect the first redistribution structure, wherein the chip is embedded in the body penetration hole, electrically connected to the portion of the upper surface of the first redistribution structure, and sealed by an encapsulation layer.

5. The semiconductor package of claim 1, wherein the diffusion barrier layer includes silicon nitride, and the warpage control layer includes silicon oxide.

6. The semiconductor package of claim 1, wherein a lowermost redistribution layer among the plurality of redistribution layers serves as an external connection redistribution layer, and the semiconductor package further comprises an external connection terminal connected to the external connection redistribution layer.

7. The semiconductor package of claim 1, further comprising:

a redistribution pad on an uppermost redistribution layer among the plurality of redistribution layers; and an internal connection terminal on the redistribution pad, wherein the internal connection terminal electrically connects a chip pad of the chip.

8. The semiconductor package of claim 1, wherein the plurality of redistribution vias includes a chip connection redistribution via, and the chip connection redistribution via is electrically connected to a chip pad of the chip.

9. The semiconductor package of claim 1, wherein the base layer includes a photo imageable dielectric (PID) layer, and the base support layer includes a metal layer.

10. A semiconductor package comprising:

a package body including a fan-in area and a fan-out area surrounding the fan-in area, wherein the fan-out area includes a body wiring structure;

a fan-in chip structure disposed in the fan-in area, wherein the fan-in chip structure includes a chip; and a first redistribution structure disposed under the fan-in area and the fan-out area and electrically connected to the body wiring structure, wherein the first redistribution structure includes:

a vertically stacked plurality of redistribution layers;

a respectively intervening plurality of passivation layers insulating the plurality of redistribution layers; and a plurality of redistribution vias penetrating the plurality of passivation layers to electrically connect redistribution layers among the plurality of redistribution layers, wherein each passivation layer among the plurality of passivation layers includes a diffusion barrier layer on a corresponding redistribution layer among the plurality of redistribution layers, and a warpage control layer on the diffusion barrier layer, wherein the diffusion barrier layer and the warpage control layer are electrically insulating, wherein the warpage control layer is at a same vertical level as the corresponding redistribution layer, wherein each of the plurality of redistribution layers comprises a plurality of redistribution patterns horizontally spaced apart from each other, and the diffusion barrier layer covers side surfaces of the plurality of redistribution patterns and is between the plurality of redistribution patterns, wherein at least one of the plurality of redistribution layers is a base passivation layer including a base layer and a base support layer disposed on the base layer, and the base passivation layer is disposed between two redistribution layers among the plurality of redistribution layers.

11. The semiconductor package of claim 10, wherein the diffusion barrier layer includes silicon nitride, and the warpage control layer includes silicon oxide.

12. The semiconductor package of claim 10, further comprising:

a second redistribution structure disposed on an upper surface of the package body, and extending over the fan-in area and the fan-out area, and electrically connected to the body wiring structure, wherein the second redistribution structure comprises:

a vertically stacked second plurality of redistribution layers;

a respectively intervening second plurality of passivation layers insulating the second plurality of redistribution layers; and a second plurality of redistribution vias penetrating the second plurality of passivation layers to electrically connect second redistribution layers among the second plurality of redistribution layers, wherein each second passivation layer among the second plurality of passivation layers includes a second diffusion barrier layer on a corresponding redistribution layer among the second plurality of redistribution layers, and a second warpage control layer on the diffusion barrier layer.

13. The semiconductor package of claim 10, wherein the package body includes an encapsulation layer in at least the fan-in area to seal the fan-in chip structure, and the body wiring structure includes a metal post.

14. The semiconductor package of claim 10, wherein the package body comprises:

a substrate including a body penetration hole, wherein the substrate includes at least one semiconductor material, wherein the fan-in chip structure is embedded in the body penetration hole and sealed by an encapsulation layer.

15. A semiconductor package comprising:

a first redistribution structure;

a chip disposed on the first redistribution structure, wherein the chip includes a backend level wiring layer and a chip pad electrically connected to the backend level wiring layer; and a package body disposed on the first redistribution structure and covering opposing side surfaces of the chip, wherein the first redistribution structure includes:

a vertically stacked plurality of redistribution layers, wherein the chip pad is electrically connected to an uppermost redistribution layer among the plurality of redistribution layers;

a respectively intervening plurality of passivation layers insulating the plurality of redistribution layers; and a plurality of redistribution vias penetrating the plurality of passivation layers to electrically connect redistribution layers among the plurality of redistribution layers, wherein each passivation layer among the plurality of passivation layers includes a diffusion barrier layer on a corresponding redistribution layer among the plurality of redistribution layers, and a warpage control layer on the diffusion barrier layer, wherein the diffusion barrier layer and the warpage control layer are electrically insulating, wherein a thickness of the warpage control layer is greater than a thickness of the diffusion barrier layer, wherein each of the plurality of redistribution layers comprises a plurality of redistribution patterns horizontally spaced apart from each other, and the diffusion barrier layer covers side surfaces of the plurality of redistribution patterns and is between the plurality of redistribution patterns, wherein at least one of the plurality of redistribution layers is a base passivation layer including a base layer and a base support layer disposed on the base layer, and the base passivation layer is disposed between two redistribution layers among the plurality of redistribution layers.

16. The semiconductor package of claim 15, comprising:
an encapsulation layer covering the opposing side surfaces of the chip;
a body wiring structure extending through the encapsulation layer to electrically connect the first redistribution structure;
a chip wiring structure disposed on the chip; and
a second redistribution structure disposed on the encapsulation layer and the chip wiring structure and electrically connected to the chip wiring structure and the body wiring structure.

17. The semiconductor package of claim 15, wherein the package body comprises:
a substrate including a penetration hole, wherein the substrate includes at least one of a semiconductor substrate, an insulating material, a wiring substrate, an interposer and a printed circuit board;
a body wiring structure extending through the substrate to electrically connect the first redistribution structure; and
a second redistribution structure disposed on the substrate and electrically connected to the body wiring structure,
wherein the chip is embedded in the penetration hole and sealed by an encapsulation layer.

18. The semiconductor package of claim 15, wherein each diffusion barrier layer includes silicon nitride, and each warpage control layer includes silicon oxide.

* * * * *